(12) United States Patent
Li et al.

(10) Patent No.: US 7,244,674 B2
(45) Date of Patent: Jul. 17, 2007

(54) PROCESS OF FORMING A COMPOSITE DIFFUSION BARRIER IN COPPER/ORGANIC LOW-K DAMASCENE TECHNOLOGY

(75) Inventors: Chaoyong Li, Singapore (SG); Siaw Suian Sabrina Su, Singapore (SG); Moitreyee Mukherjee-Roy, Singapore (SG); Ramana Murthy Badam, Singapore (SG)

(73) Assignee: Agency for Science Technology and Research, Singapore (SG)

( * ) Notice: Subject to any disclaimer, the term of this patent is extended or adjusted under 35 U.S.C. 154(b) by 85 days.

(21) Appl. No.: 10/833,177

(22) Filed: Apr. 27, 2004

(65) Prior Publication Data

US 2005/0239278 A1    Oct. 27, 2005

(51) Int. Cl.
*H01L 21/4763* (2006.01)

(52) U.S. Cl. .................. 438/643; 438/627; 438/653

(58) Field of Classification Search ................ 438/623, 438/627, 638, 643, 622, 624, 625, 637, 652, 438/653, 672, 675
See application file for complete search history.

(56) References Cited

U.S. PATENT DOCUMENTS

| | | | | |
|---|---|---|---|---|
| 6,057,236 A * | 5/2000 | Clevenger et al. | ........... | 438/680 |
| 6,140,220 A | 10/2000 | Lin | ............................. | 438/618 |
| 6,348,733 B1 | 2/2002 | Lin | ........................... | 257/758 |
| 6,444,568 B1 | 9/2002 | Sundararajan et al. | ...... | 438/627 |
| 6,541,842 B2 | 4/2003 | Meynen et al. | ............. | 257/632 |
| 6,649,531 B2 * | 11/2003 | Cote et al. | ................... | 438/714 |
| 6,740,580 B1 * | 5/2004 | Gupta et al. | ................ | 438/627 |
| 6,939,800 B1 * | 9/2005 | Lu et al. | ..................... | 438/643 |
| 2002/0027286 A1 | 3/2002 | Sundararajan et al. | ...... | 257/751 |

FOREIGN PATENT DOCUMENTS

GB             365215 A       2/2002

OTHER PUBLICATIONS

"Advanced Metal Barrier Free Cu Damascene Inter-connects with PECVD Silicon Carbide Barriers for 90/65 nm BEOL Technology", IEDM 2002, Wu et al., pp. 595-598.

* cited by examiner

*Primary Examiner*—Kevin M. Picardat
(74) *Attorney, Agent, or Firm*—Saile Ackerman LLC; Stephen B. Ackerman; Stephen G. Stanton

(57) ABSTRACT

A method of forming a composite barrier layer comprising the following steps. A substrate having a dielectric layer formed thereover is provided. An opening exposing a first portion of the substrate is formed within the dielectric layer. A dielectric flash layer is formed within the opening and over the first exposed portion of the substrate. The dielectric flash layer lines the opening. The bottommost horizontal portion of the dielectric flash layer is removed to expose a second portion of the substrate. An aluminum layer is formed over the etched dielectric flash layer and over the second exposed portion of the substrate. A barrier metal layer is formed over the aluminum layer. The etched dielectric flash layer, the aluminum layer and the barrier metal layer comprise the composite barrier layer. A planarized metal plug is formed within the barrier metal layer lined opening.

75 Claims, 18 Drawing Sheets

PROCESS OF FORMING A COMPOSITE DIFFUSION BARRIER IN COPPER/ORGANIC LOW-K DAMASCENE TECHNOLOGY

FIELD OF THE INVENTION

The present invention relates generally to integrated circuits and specifically to integrated circuits with copper-based damascene interconnects.

BACKGROUND OF THE INVENTION

Integrated circuits are widely used in electronic devices of many types. Conventional aluminum (Al) and Al alloys have been widely used as interconnection materials for integrated circuits. However, the downscaling of metal interconnect lines and the increased electrical current density will result in greater RC time delay along with enhanced electromigration (EM) and stress-induced void failures.

The article entitled "Advanced Metal Barrier Free Cu Damascene Interconnects with PECVD Silicon Carbide Barriers for 90/65 nm BEOL Technology", IEDM 2002, Wu et al., pages 595 to 598, describes the use of SiC to replace the barrier metal layer to achieved improved ET results and a lower dielectric constant (k) in copper (Cu)/low-k technology.

U.S. Pat. No. 6,541,842 B2 to Meynen et al. describes an integrated circuit wherein a sealing dielectric layer is applied between a porous dielectric layer and a metal diffusion barrier layer. The sealing dielectric layer closes the pores on the surface and sidewalls of the porous dielectric layer. The sealing dielectric layer is a CVD deposited film having the composition $Si_xC_yH_z$.

U.S. Patent Application Publication No. US 2002/0027286 A1 to Sundararajan et el. describes a method of forming a semiconductor device (and the device so formed) by forming a metal portion over underlying portions; depositing a single layer of silicon carbon nitride (SiCN) layer over the metal portion; and depositing a dielectric layer over the SiCN layer.

U.S. Pat. Nos. 6,140,220 and 6,348,733 B1 to Lin each describe dual damascene process and structure with dielectric barrier layer.

U.S. Pat. No. 6,444,568 B1 to Sundararajan et el. describes a method of forming a copper diffusion barrier.

UK Patent Application No. GB 2 365 215 A to McGahay et al. describes a method of forming a semiconductor device (and the device so formed) by forming a composite diffusion barrier between a copper structure and an insulating layer wherein the composite diffusion barrier comprises a layer of dense material and a film of material capable of forming a protective oxide in a self-limiting manner in the presence of oxygen or water.

SUMMARY OF THE INVENTION

Accordingly, it is an object of the present invention to provide a method of forming a composite barrier layer for copper (Cu) metallization interconnection in semiconductor integrated circuits (IC).

It is a further object of the invention to provide a method of forming a barrier layer having good adhesion strength to organic low k materials, without pinholes for Cu metallization using standard complimentary metal oxide semiconductor (CMOS) process steps with damascene technology.

It is another object of the invention to provide a novel composite barrier layer for Cu metallization interconnection in semiconductor integrated circuits.

Other objects will appear hereinafter.

It has now been discovered that the above and other objects of the present invention may be accomplished in the following manner. Specifically, a substrate having a dielectric layer formed thereover is provided. An opening exposing a first portion of the substrate is formed within the dielectric layer. A dielectric flash layer is formed within the opening and over the first exposed portion of the substrate. The dielectric flash layer lines the opening. The bottommost horizontal portion of the dielectric flash layer is removed to expose a second portion of the substrate. An aluminum layer is formed over the etched dielectric flash layer and over the second exposed portion of the substrate. A barrier metal layer is formed over the aluminum layer. The etched dielectric flash layer, the aluminum layer and the barrier metal layer comprise the composite barrier layer. A planarized metal plug is formed within the barrier metal layer lined opening.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
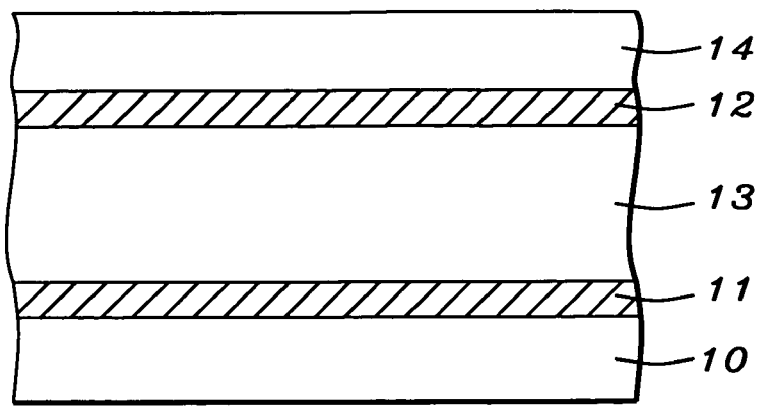
FIGS. 1 to 10 illustrate a preferred embodiment of the present invention.

It is noted that the composite barrier layer 66 of the present invention includes a dielectric flash layer (DFL) 41 and an aluminum (Al) layer 51 as well as a barrier metal layer 52.

For the purposes of this invention a low dielectric constant (low-k) is a dielectric constant of less than about 3.0 and ultra-low-k is a dielectric constant of less than about 2.5.

Problem/Information Known to the Inventors—Not to be Considered Prior Art

The following is a problem/information known to the inventors and is not to be considered prior art for the purposes of the present invention.

To solve these functionality and reliability problems, an intense research effect has been focused on copper metallization and low-k or Cu/ultra-low-k scheme due to the facts that: a) Cu has low bulk resistivity (1.68 µOhm/cm for Cu, 2.7 µOhm/cm for Al), excellent electro-migration resistance and high stress voiding resistance; and b) low-k is less than about 3.0 or ultra-low-k is less than about 2.5.

To integrate Cu into low-k or ultra-low-k applications, a robust barrier metal layer is required to prevent Cu diffusion. That is, robust barrier metal layer means that the barrier layer should have good thermal stability and can prevent copper (Cu) diffusion.

However, with the integration of organic low-k materials as inter-metal dielectrics (IMD) in the Cu dual damascene interconnects, the traditional physical vapor deposition (PVD) sidewall diffusion barriers such as tantalum (Ta) or tantalum nitride (TaN) become more challenging. The poor step coverage of PVD process makes it difficult to completely seal the rough surfaces of organic low-k materials at the sidewalls, especially near the via/trench bottom. The barrier metal layers deposited onto porous low-k dielectrics with conventional PVD processes such as Ta or TaN are typically found to be permeable due to the presence of pores or pinholes. The end result is Cu penetration into porous IMD after thermal cycling and significant deterioration of the electrical performance and the reliability of Cu/porous ultra low-k interconnects. Especially, with the technology node down to smaller feature size, the barrier metal layer should be thinner. Thus, it is necessary to reduce the Ta or TaN layer thickness as much as possible to keep the Cu line resistance low. However, the thinner the barrier metal, the more pin holes appears. The traditional PVD barrier metal on the sidewall is not sufficient to seal the rough side wall of the damascene structure of the organic low k and Cu could diffuse into IMD.

Another problem is, because the thermal expansion coefficient (CTE) is significantly different between metal (for example: Ta~6 ppm/c) and porous organic materials (for example: porous SiLK~65 ppm/c), it has a catastrophic impact on the reliability and electrical performance even after a low temperature (200° C.~400° C.) thermal cycle.

Another problem is, the moisture, oxygen, etc. absorbed in the organic low k materials may not be removed even after bake out. The oxygen and moisture may diffuse into Cu through the thin barrier metal or the pin hole of the barrier metal, resulting in Cu oxidation or corrosion. It impacts on the reliability and electrical performance of Cu interconnects.

There was reported that the electrical performance could be improved by using the plasma enhanced chemical vapor deposition (PECVD) dielectrics instead of the PVD Ta as the sidewall diffusion barrier. However, this change may have some problems on integration into current Cu dual damascene process flow because Ta also works as adhesion promoter between Cu and different dielectrics, which is very important.

The Present Invention

In the present invention, a novel dielectrics/metal composite sidewall barrier layers is proposed to improve the reliability and performance of Cu/organic low-k interconnects as well as to enhance the adhesion issue in Cu damascene processes.

More specifically, the present invention will describe a process for forming composite barrier layers in the fabrication of ICs with damascene Cu/organic low-k technology on semiconductor wafers. More particularly, this invention relates to a method for providing a robust barrier layer with very good adhesion strength to organic low-k material, without pinholes, that is particularly useful as a barrier layer in Cu/organic integration schemes.

The present invention includes the steps of:

1) Depositing a layer of $Si_xC_yO_z$ or $Si_xC_yN_z$, a so-called dielectric flash layer (DFL) thin layer (from about 5 to 20 nm thick) using plasma enhance chemical deposition (PECVD) technique or other deposition techniques. This DFL has a high density and with good adhesion strength to organic low k materials and provides smooth dielectric seed which can reduce pinhole of thin barrier metal layer in damascene structures. This DFL also acts as an additional barrier against Cu diffusion.

2) Etching back, using plasma sputtering or other etching processes, to strip the DFL at the bottom of trenches and/or vias in the damascene structure.

3) The deposition of a thin aluminum (Al) layer (from about 2 to 10 nm thick) using PVD techniques or other deposition technique at low temperature (below 250° C.). This layer may act as gettering layer which can absorb oxygen ($O_2$) from the organic low-k material and prevent oxygen diffusion into the Cu resulting in Cu oxidation or corrosion.

4) Deposition of a thin barrier metal layer (preferably Cr, Nb, Ti, Mo, W, or Ta, or one of their nitrides) (from about 2 to 15 nm thick) and a Cu seed layer using standard PVD technique at a low temperature of below 250° C., respectively.

5) Followed by a standard electrochemical plating (ECP) Cu fill and Cu annealing as well as standard chemical mechanical polishing (CMP) process.

While the specific illustration of the present invention is to its application in forming robust diffusion barrier layers, one skilled in the art would recognize that the present invention is more general than this and may be applied to barrier layers in other film coatings on organic materials.

The composite barrier layer 66 includes: DFL 41", Al layer 51 and metal barrier layer 52'.

Initial Structure—FIG. 1

FIG. 1 illustrates the initial structure of the present invention. A lower etch stop layer 11 is formed over substrate 10, which is preferably a transistor built in silicon substrate. Lower etch stop layer 11 is preferably silicon carbide (SiCO—H) or BloK (SiCN—H, SiC—H).

An organic dielectric layer 13 is formed over lower etch stop layer 11 to a thickness of preferably from about 350 nm to 1250 nm and more preferably from about 350 nm to 950 nm. Organic dielectric layer 13 is preferably comprised of a low-k dielectric polymer such as SiLK (manufactured by The Dow Chemical Company), porous-SiLK or nano-glass and is more preferably porous SiLK and has a dielectric constant (k) of preferably from about 2.0 to 2.8 and more preferably from about 2.2 to 2.6.

An upper etch stop layer 12 is formed over organic dielectric layer 13 to a thickness of preferably from about 30 to 70 nm and more preferably from about 40 to 60 nm. Upper etch stop layer 12 is preferably silicon carbide (SiCO—H) or BloK (SiCN—H, SiC—H).

An upper dielectric layer 14 is formed over upper etch stop layer 12 to a thickness of preferably from about 100 to 200 nm and more preferably from about 150 to 200 nm. Upper dielectric layer 14 is preferably comprised of $SiO_2$, a chemical vapor deposited film or undoped silicate glass materials and is more preferably $SiO_2$.

Figure 2:
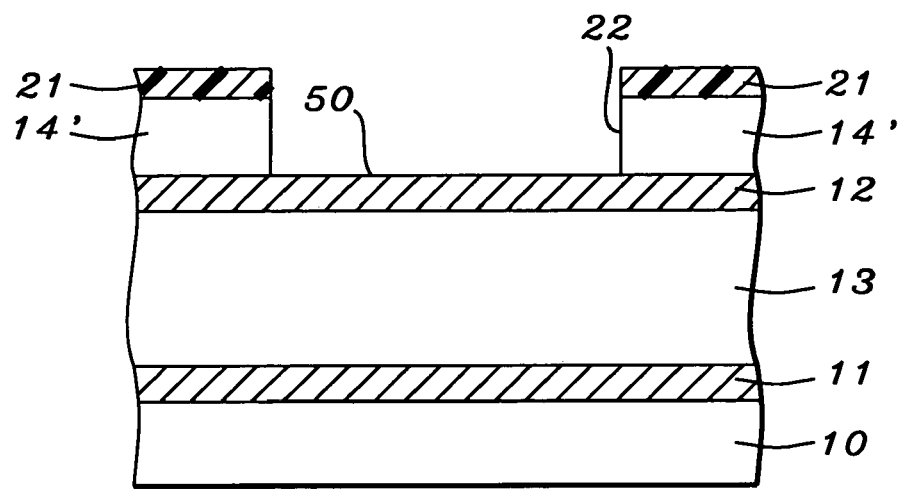

Formation of First Dummy Trench 22—FIG. 2

As shown in FIG. 2, a first patterned photoresist layer 21 is formed over upper dielectric layer 14 and upper dielectric layer 14 is patterned, preferably by etching, to form first dummy trench 22, exposing a portion 50 of upper etch stop layer 12.

Dummy trench 22 has a depth of preferably from about 100 to 200 nm and more preferably from about 150 to 200 nm and a width of preferably from about 0.10 to 0.30 microns and more preferably from about 0.13 to 0.22 microns.

First patterned photoresist layer 21 is then stripped and removed and the structure is cleaned as necessary.

Figure 3:
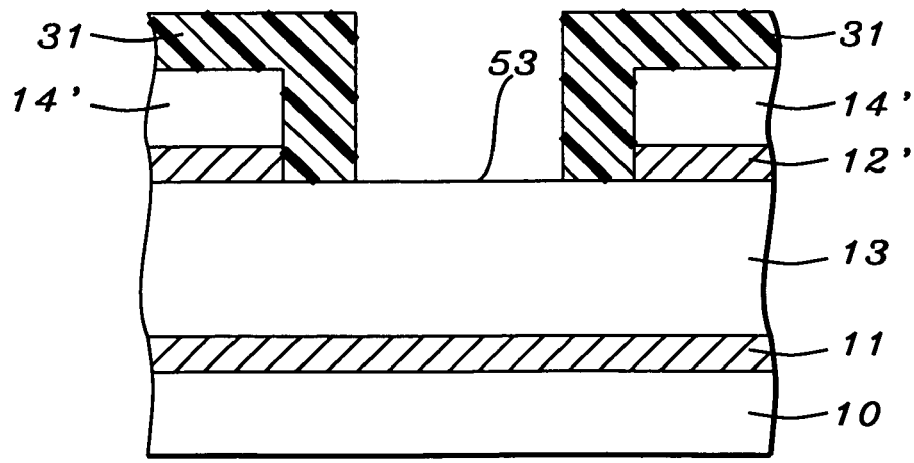

Patterning of Upper Etch Stop Layer 12—FIG. 3

As shown in FIG. 3, a second patterned photoresist layer 31 is formed over patterned upper dielectric layer 14' and a portion of the exposed 50 upper etch stop layer 12 and the remaining exposed upper etch stop layer 12 is patterned to expose a portion 53 of the underlying organic dielectric layer 13.

Second patterned photoresist layer 31 has a thickness of preferably from about 3500 to 7000 Å and more preferably from about 4500 to 6000 Å.

Figure 4:
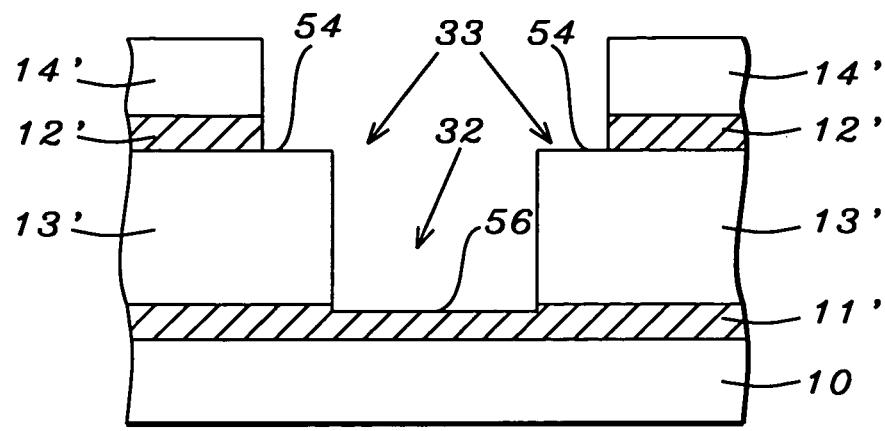

Formation of Second Dummy Trench 33 and Initial Via 32—FIG. 4

As shown in FIG. 4, using the second patterned photoresist layer 31 and the patterned upper etch stop layer 12' as masks, the exposed portion 53 of organic dielectric layer 13 is patterned down to, and may be into, lower etch stop layer 11 by over-etching to form initial via 32 (and second dummy trench 33).

The over-etched portion 56 of lower etch stop layer 11' has a thickness of preferably from about 75 to 200 Å and more preferably from about 100 to 150 Å.

Second patterned photoresist layer 31 is then stripped and the structure is cleaned as necessary. This clearly shows second dummy trench 33 that exposes portions 54 of patterned organic dielectric layer 13'.

Figure 5:
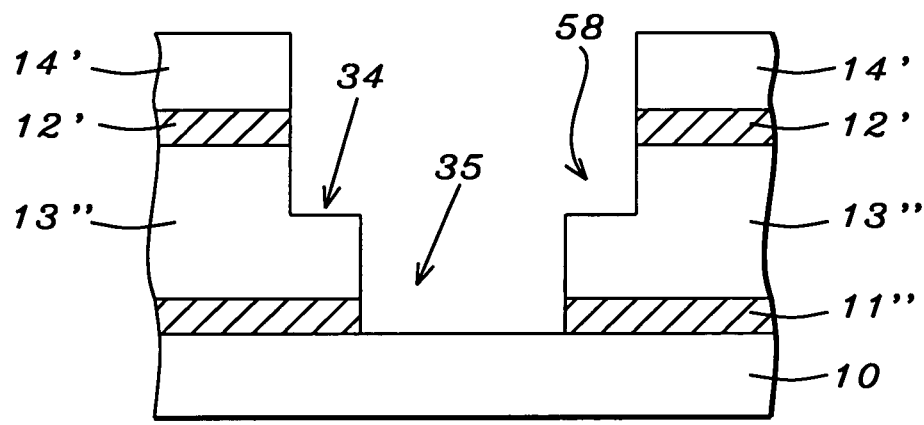

Completion of (Dual) Damascene Opening 58—FIG. 5

As shown in FIG. 5, the exposed portions 54 of patterned organic dielectric layer 13' and the over-etched portion 56 of lower etch stop layer 11' are etched to form trench 34 and completed via 35 comprising (dual) damascene opening 58.

Trench 34 has a depth of preferably from about 0.40 to 0.80 microns and more preferably from about 0.4 to 0.6 microns and a width of preferably from about 0.10 and 0.30 microns and more preferably from about 0.13 to 0.22 microns.

Via 35 has a depth of preferably from about 0.60 to 1.50 microns and more preferably from about 0.60 to 1.20 microns and a size in diameter of preferably from about 0.10 and 0.30 microns and more preferably from about 0.13 to 0.22 microns.

Plasma and/or chemical treatments may then be used to strip any polymer residues.

While the formation of a dual damascene opening 58 is illustrated herein, it is understood that just a damascene opening may be formed.

Figure 6:
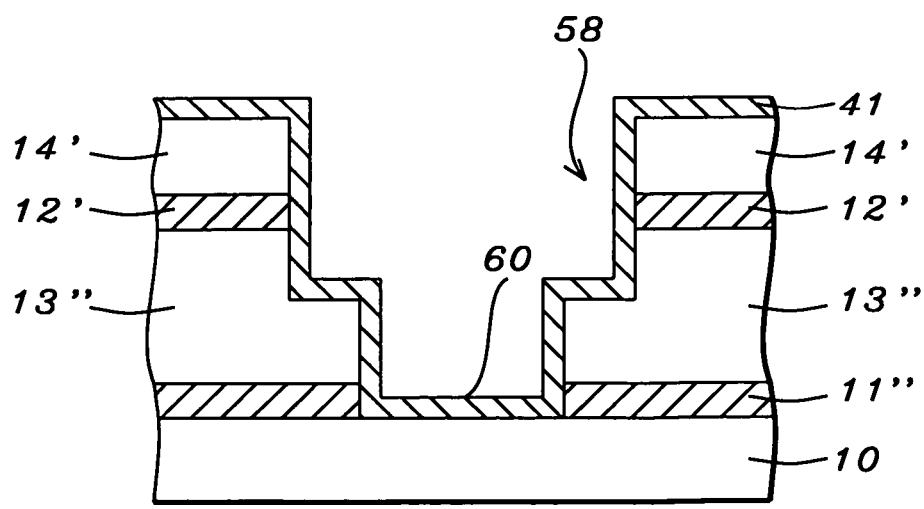

Formation of Dielectric Flash Layer (DFL) 41—FIG. 6

Then, as shown in FIG. 6 a dielectric flash layer (DFL) 41 is formed within damascene/dual damascene opening 58, lining damascene/dual damascene opening 58, to a thickness of preferably from about 5 to 20 nm and more preferably from about 10 to 20 nm. DFL 41 is a dielectric material and is preferably comprised of $Si_xC_yN_z$—H, $Si_xC_yO_z$—H, $Si_xC_y$—H, $Si_xN_y$, or $SiO_2$, is more preferably $Si_xC_yN_z$—H or $Si_xC_yO_z$—H or $Si_xC_y$—H and is most preferably $Si_xC_yN_z$—H or $Si_xC_yO_z$—H.

DFL 41 includes a bottommost portion 60 overlying substrate 10.

DFL 41 is formed preferably using plasma enhanced chemical vapor deposition (PECVD) techniques or other deposition techniques. Examples of suitable gases used to form DFL 41 include, but are not limited to, 3-methyl silane (3MS) or 4-methyl silane (4MS) with $NH_3$ or $N_2O$. DFL 41 is formed under the following conditions: a pressure of preferably from about 1.0 to 5.0 Torr and more preferably from about 1.5 to 4.0 Torr; a power level of preferably from about 150 to 1000 watts and more preferably from about 300 to 800 watts; and a temperature of preferably from about 150 to 400° C. and more preferably from about 250 to 350° C. for a time of preferably from about 1.0 to 5.0 seconds and more preferably from about 2.0 to 4.0 seconds.

DFL 41 is of a high density and has good adhesion strength to the patterned organic low-k dielectric layer 13" and provides a smooth dielectric seed which can reduce the number of pinholes in a thin barrier metal layer. The sidewall of the damascene opening 58 of ULK is very rough after the formation of the damascene structure. If the thin barrier metal layer is deposited using PVD technique, the barrier metal could not seal the rough sidewall due to poor step-coverage of PVD technique. Thus, pin-holes could appear on the barrier metal layer on the sidewall.

Figure 7:
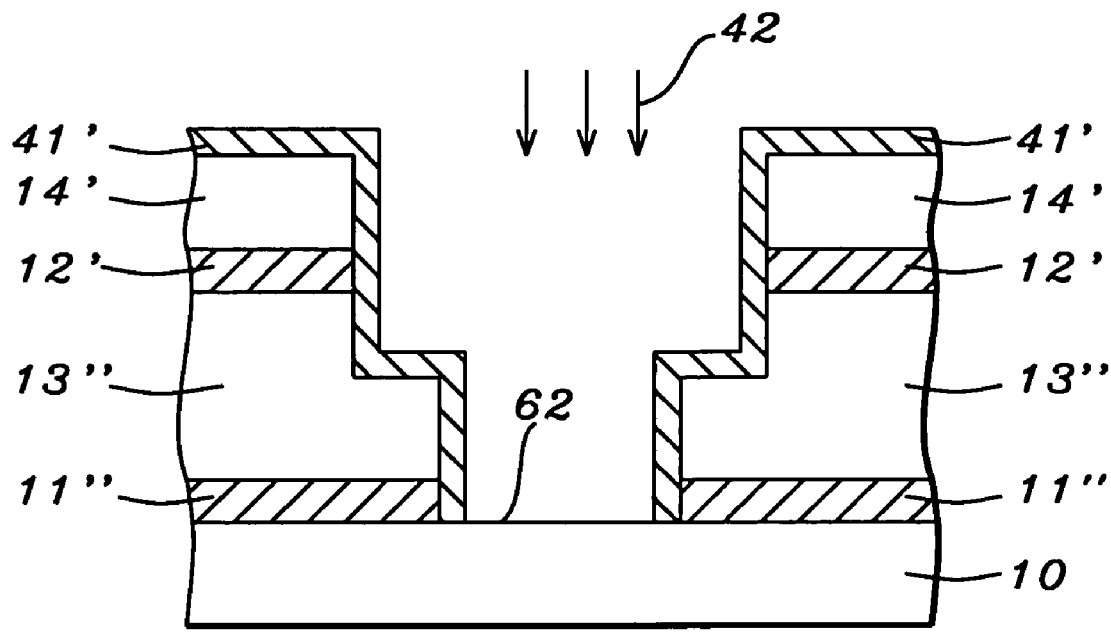

Removal of the Bottommost Portion 60 of DFL 41—FIG. 7

As shown in FIG. 7, the bottommost portion 60 of DFL 41 is removed to expose a portion 62 of underlying substrate 10. Portion 60 of DFL 41 is preferably removed by a plasma sputtering process or a plasma etching process 42 which is preferably a fluorine based gas such as $CH_2F_2$ or $CHF_3$ and more preferably $CH_2F_2$ at: a pressure of preferably from about 10 to 100 mTorr and more preferably from about 25 to 60 mTorr; and a power level of preferably from about 100 to 1000 watts and more preferably from about 200 to 600 watts for preferably from about 5 to 25 seconds and more preferably from about 5 to 20 seconds.

Figure 8:
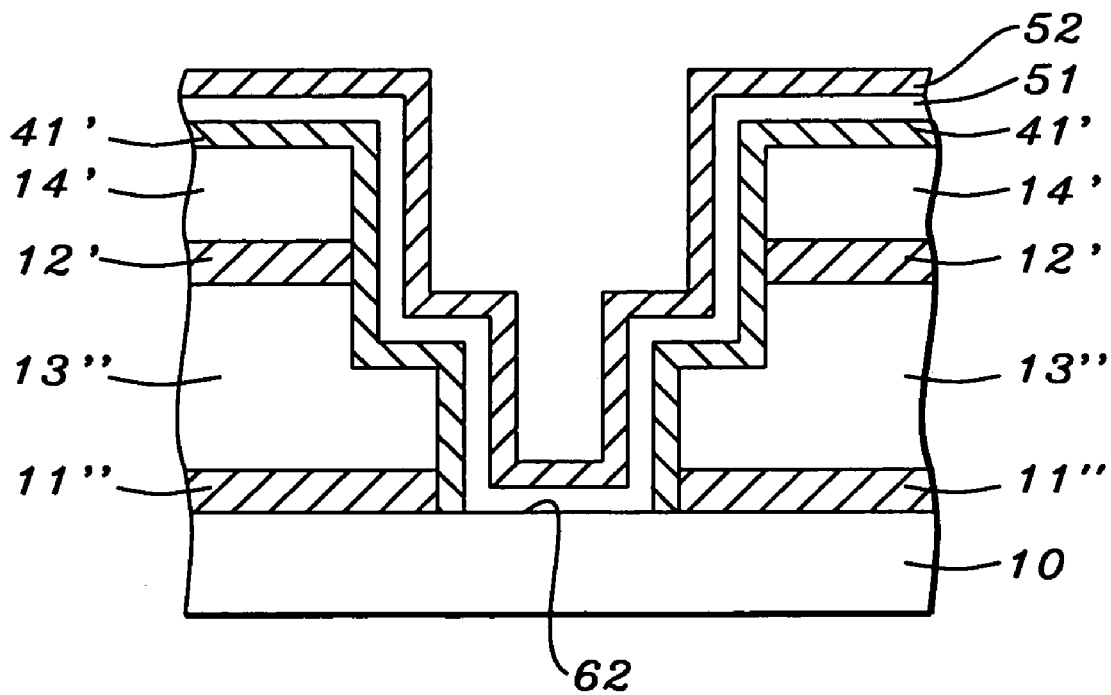

Formation of Aluminum (Al) and Barrier Metal Layers 51, 52—FIG. 8

As shown in FIG. 8, an aluminum (Al) layer 51 is then formed over the etched DFL 41' and the exposed portion 62 of substrate 10 at a temperature of less than about 250° C. to a thickness of preferably from about 2.0 to 10.0 nm and more preferably from about 5.0 to 10.0 nm using standard PVD techniques, or other techniques. Al layer 51 may act as gettering layer which can absorb oxygen ($O_2$) from the organic low-k material and prevent oxygen diffusion into the Cu resulting in Cu oxidation or corrosion.

Then a barrier metal layer 52 may be formed over Al layer 51 to a thickness of preferably from about 10 to 25 nm and more preferably from about 15 to 20 nm. Barrier metal layer 52 is preferably comprised of a refractor metal such as Cr, Nb, Mo, W or Ta, one of their nitrides (such as TaN, for example) or a composite with one of their nitrides (such as Ta/TaN for example), is more preferably Ta, TaN or Ta/TaN and is most preferably Tan. Barrier metal layer 52 acts as diffusion barrier against Cu diffusion, also provide nucleation layer for Cu seed. By using DFL and Al as well as barrier metal (Ta(N)), good interface, better adhesion between Cu, barrier and ULK could be achieved.

Figure 9:
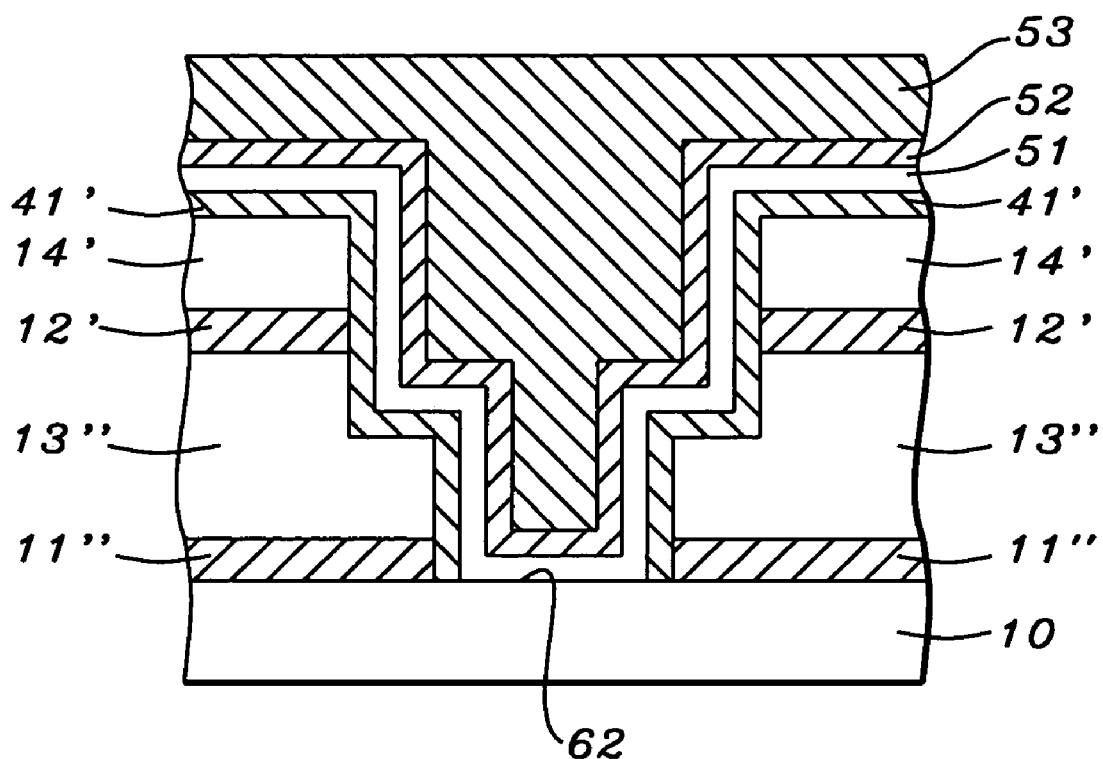

Formation of Cu Seed Layer and Cu Fill Layer 53—FIG. 9

As shown in FIG. 9, a copper (Cu) seed layer and a Cu fill layer (collectively 53) are then deposited in turn upon barrier metal layer 52 to at least fill lined dual damascene openings 58 using standard PVD or ECP techniques.

Planarization of Patterned DFL 41'/Al Layer 51/Barrier Metal Layer 52/Cu Seed/Cu Fill Layer 53

Figure 10:
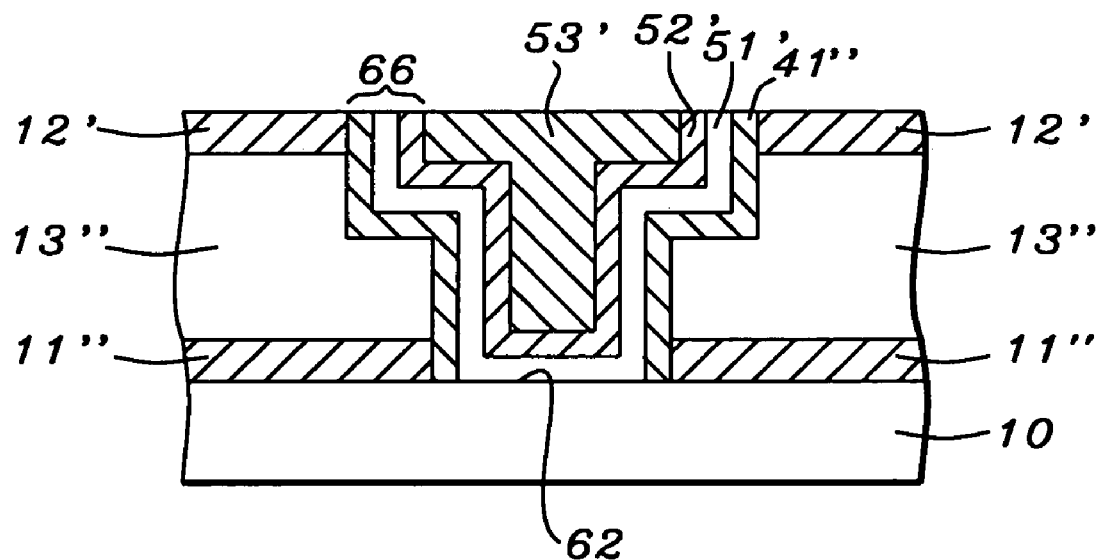

As shown in FIG. 10, patterned DFL 41', Al layer 51, barrier metal layer 52 and Cu seed/Cu fill layer 53 are then planarized, preferably by chemical mechanical polishing (CMP), to remove the excess thereof, and patterned upper dielectric layer 14', from over patterned upper etch stop layer 12'. This forms planarized Cu plug 53' within lined dual damascene opening 58 and completes formation of the composite barrier layer 66. The composite barrier layer 66 includes Al layer 51', DFL 41" and metal barrier layer 52'.

Results and Discussion

Surface Roughness of Barrier Metal Layer 52' With/Without DFL 41"

| Film Stacked | RMS (nm) |
| --- | --- |
| Ta(25 nm)/P-SiLK | 5.42 to 5.61 |
| TaN(25 nm)/p-SiLK | 4.445 to 5.01 |
| Ta/TaN(25 nm)/P-SiLK | 5.76 to 7.65 |
| Ta(25 nm)/100A SiCN/P-SiLK | 0.346 |
| TaN(25 nm)/100A SiCN/P-SiLK | 0.319 |
| TaN-Ta(25 nm)/100A SiCN/P-SiLK | 0.409 |
| Ta(25 nm)/100A SiCO/P-SiLK | 0.305 |
| TaN(25 nm)/100A SiCO/P-SiLK | 0.271 |

Based on the above Atomic Force Microscopy (AFM) results, the surface roughness of barrier metal layers 52' (i.e. Ta, TaN or Ta/TaN) have significant improvement when a DFL 41" was deposited prior to a thin layer 51' of Al and barrier metal layer 52' deposition. It could help to reduce pinhole of barrier metal layer 52', resulting in better reliability such as leakage current in the metal line.

Figure 11A:
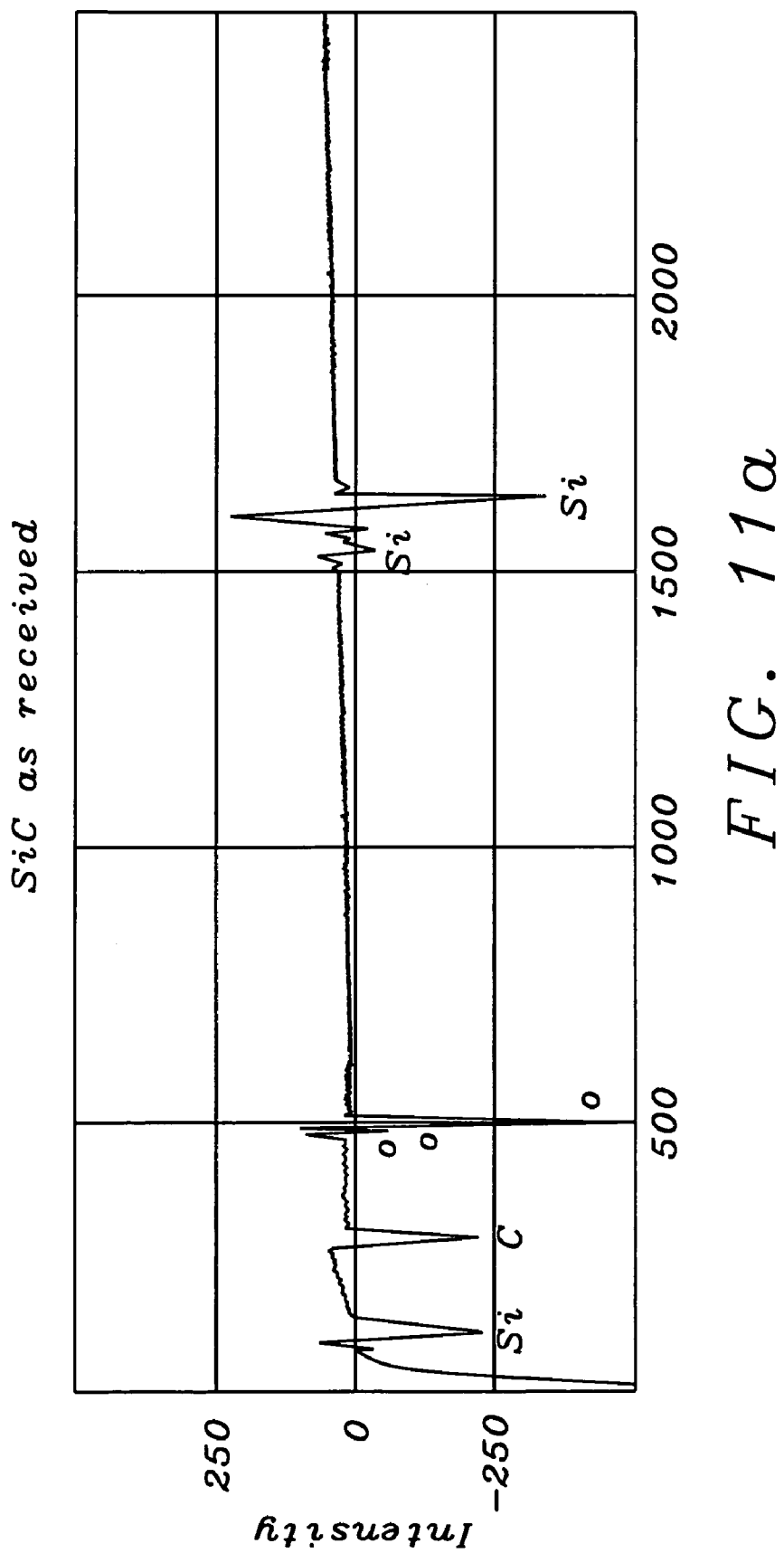
FIGS. 11A and 11B respectively illustrate Auger Spectras of DFL ($Si_xC_yO_z$) as received and after 50 seconds of ion etching.
Figure 11B:
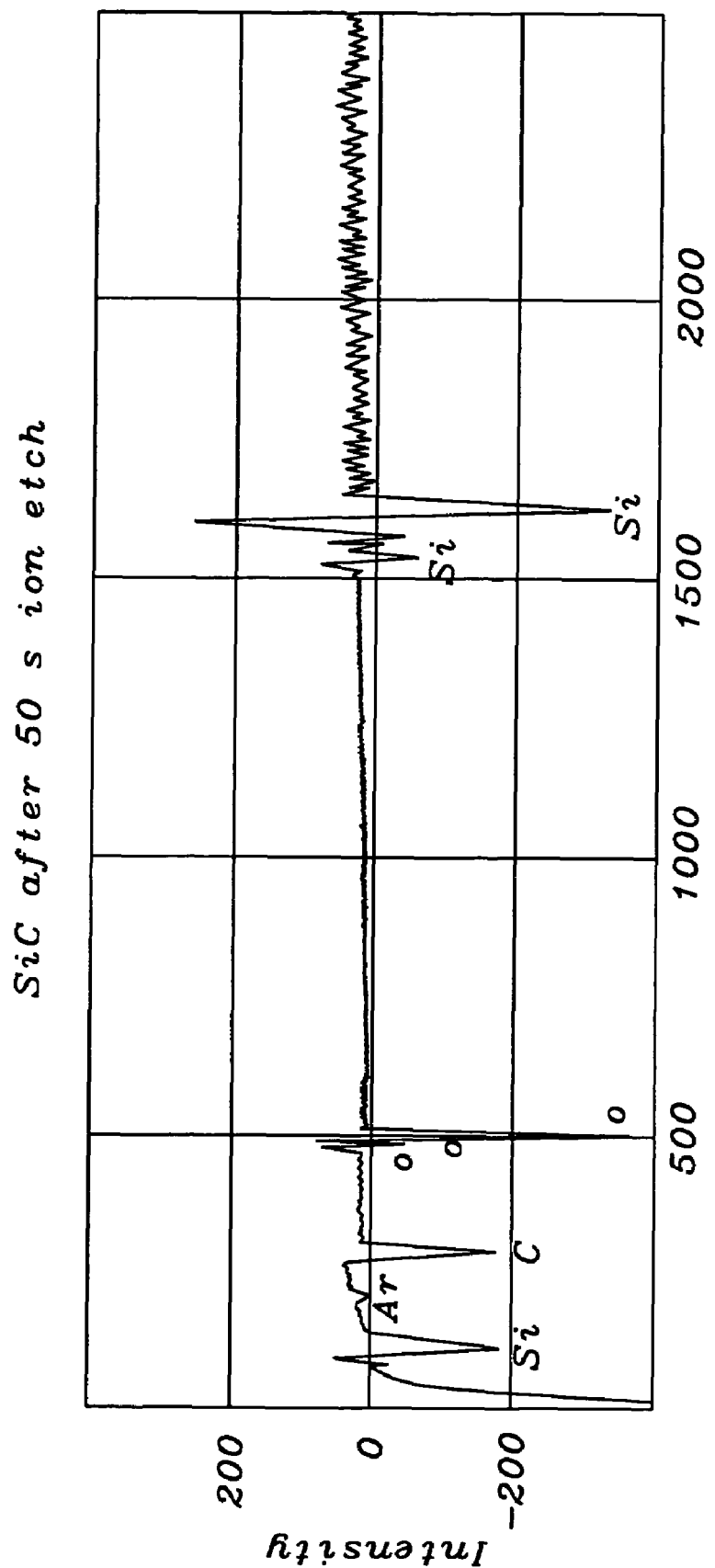
Figure 12A:
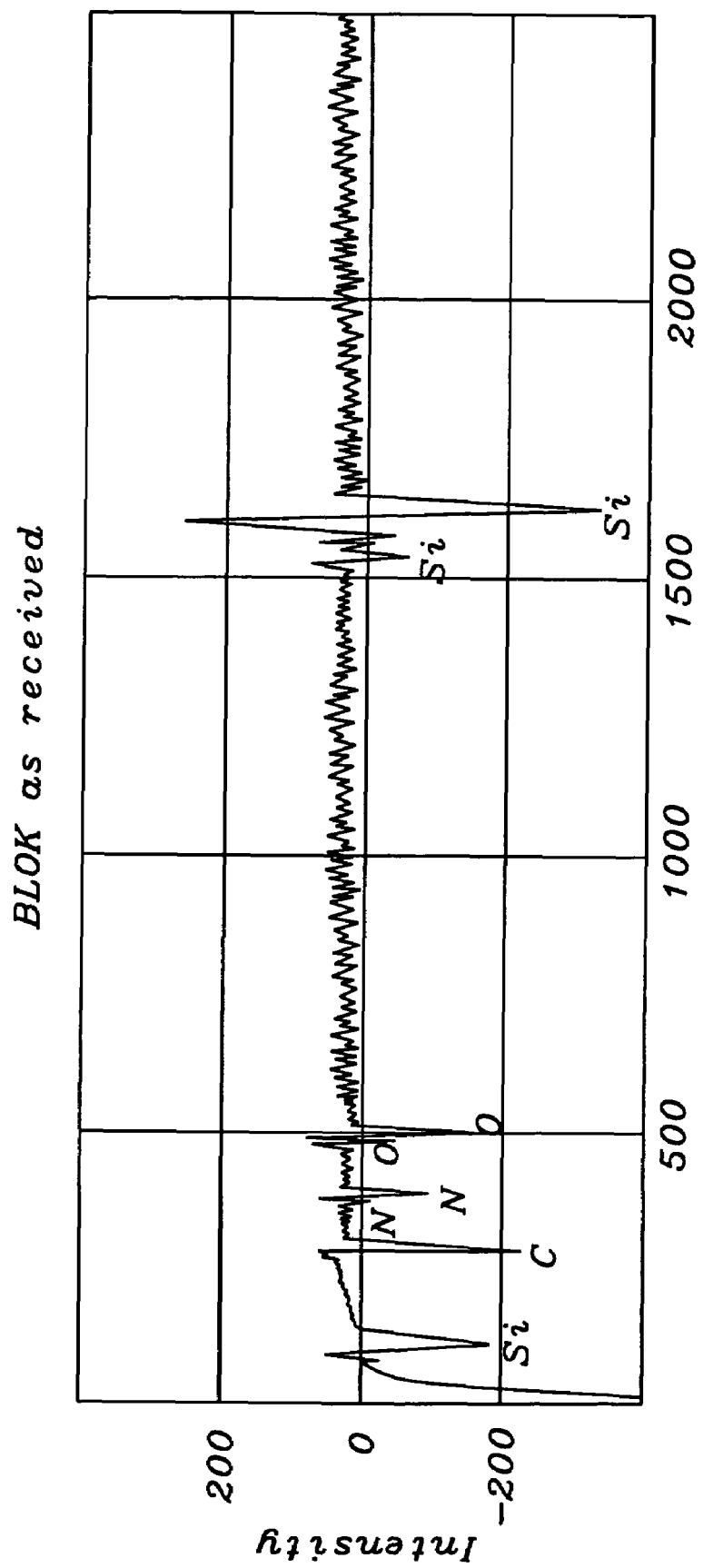
FIGS. 12A and 12B respectively illustrate Auger Spectras of DFL ($Si_xC_yN_z$) as received and after 50 seconds of ion etching.
Figure 12B:
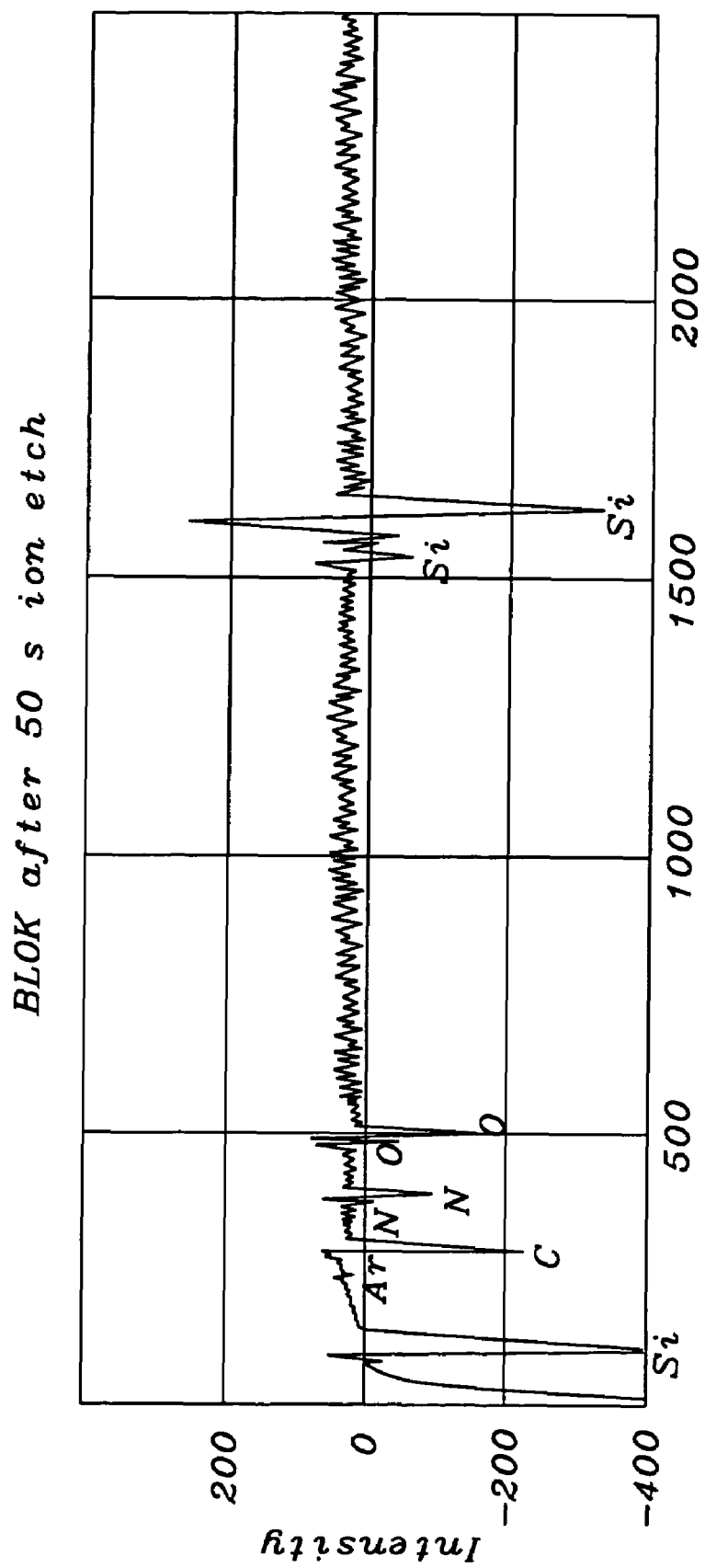

Auger Spectra of DFL 41"—FIGS. 11 and 12

In this invention, two more preferable DFL 41" are proposed and used, i.e. $Si_xC_yO_z$—H and $Si_xC_yN_z$—H. The respective compositions of the DFL 41" are shown in the Auger Spectra of FIG. 11 and FIG. 12. The top spectra in each FIGS. 11 and 12 are as received and the bottom spectra in each FIGS. 11 and 12 are after 50 seconds of ion etching.

Figure 13:
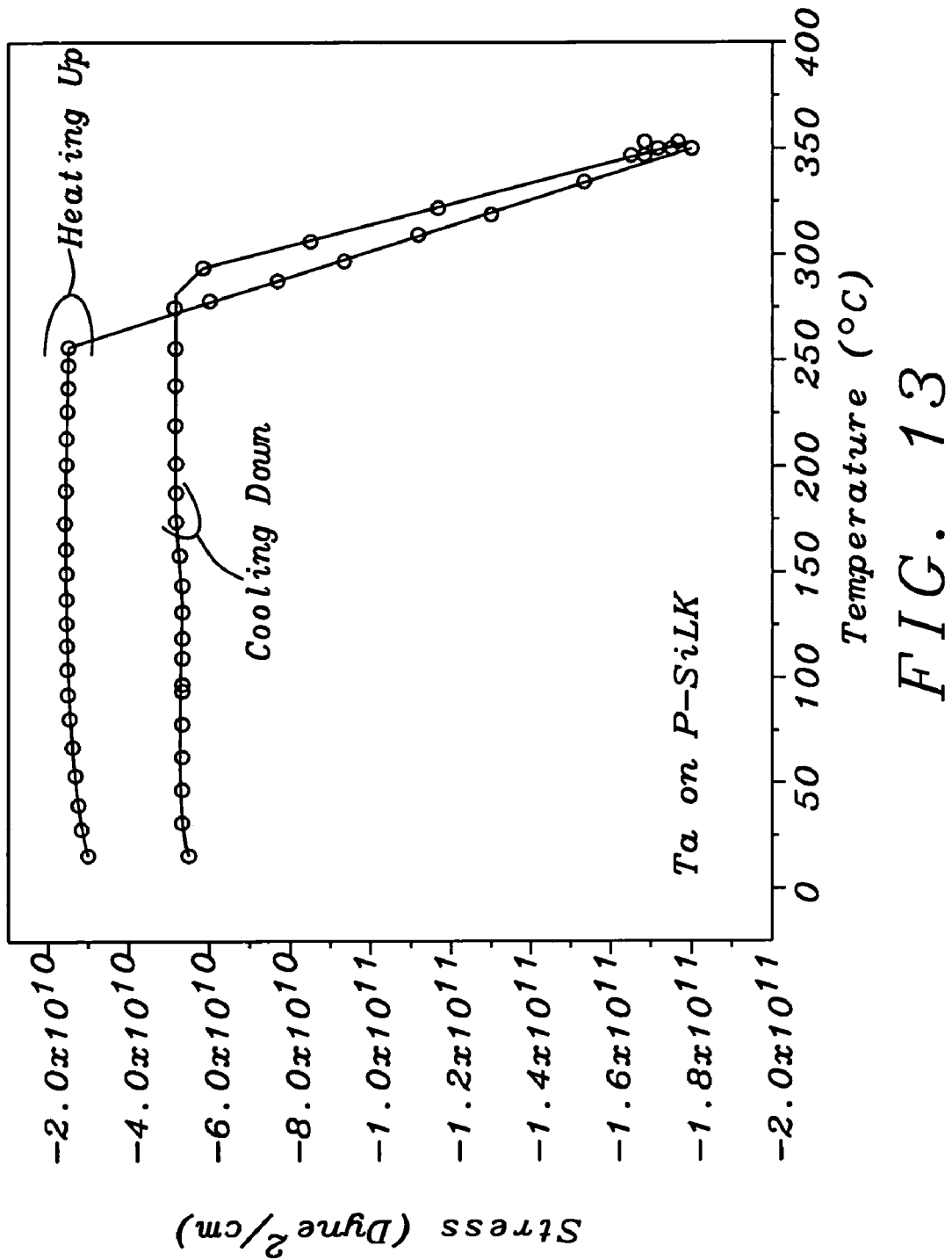
FIG. 13 illustrates the residual stress of barrier on ultra-low k materials at different temperatures.
Figure 14:
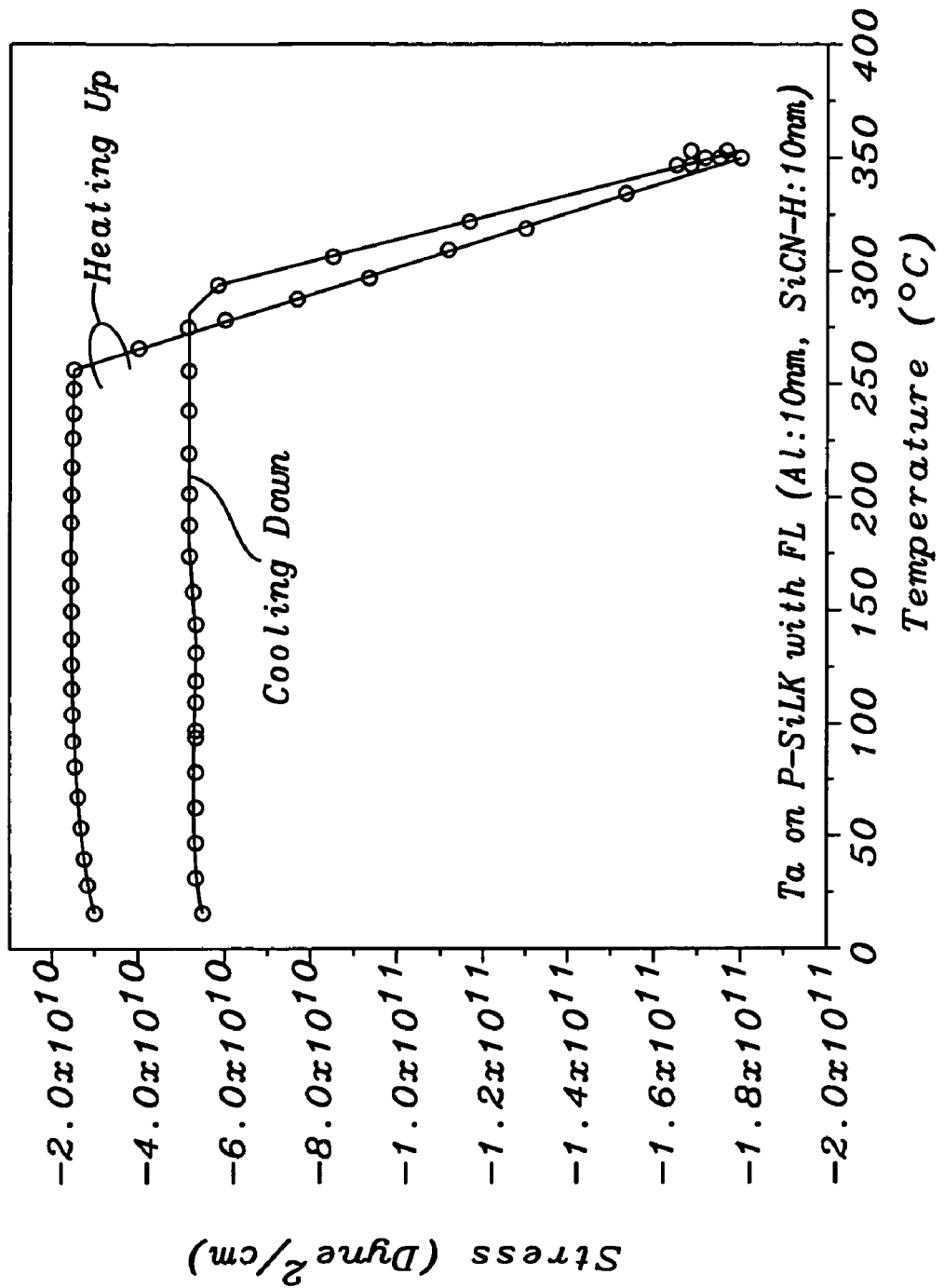
FIG. 14 illustrates the residual stress of barrier on ultra-low k materials with DFL ($Si_xC_yN_z$, 10 nm thick) at different temperatures.
Figure 15:
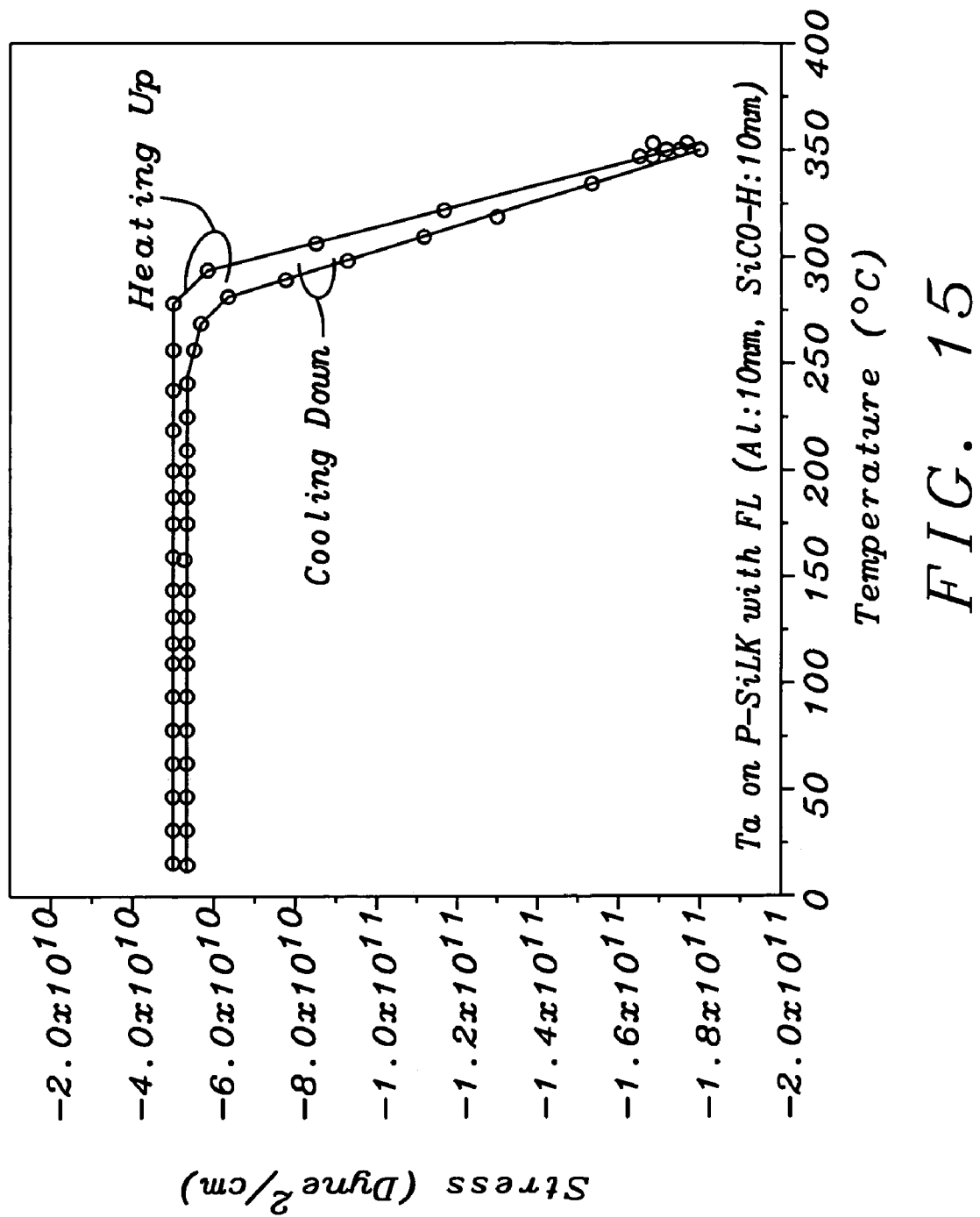
FIG. 15. illustrates the residual stress of barrier metal film on ultra-low k materials with DFL ($Si_xC_yO_z$, 10 nm thick) at different temperatures.

Residual Stress of Metal Barrier Layer 52' on Organic Dielectric Materials of Organic Dielectric Layer 13"—FIGS. 13, 14 and 15

FIGS. 13, 14 and 15 illustrate the residual stress of a typical metal barrier metal layer 52' on ultra-low k materials with and without flash layer (FL) (i.e., a thin Al layer 51' and, a DFL 41") at different temperatures.

For example FIG. 13 is a plot showing that the barrier metal (Ta) film stress increases with the increase of temperature. The change of the residual stress of Ta on ultra-low k is because of the difference of the coefficient of thermal expansion (CTE) of barrier (Ta) and organic ultra-low k (for example: CTE (ppm/c) of Ta is about 6.6 and SiLK is great than 65). The stress could cause the barrier metal crack and provide a pathway for Cu diffusion.

Further, FIG. 14 is a plot showing that the barrier metal (Ta) film stress increases with increase of temperature. The change of the residual stress of Ta on ultra-low k is because of the difference of the coefficient of thermal expansion (CTE) of barrier (Ta) and organic ultra-low k (for example: CTE (ppm/c) of Ta is about 6.6 and SiLK is great than 65). The stress could cause the barrier metal crack and provide a pathway for Cu diffusion.

The residual stress of metal barrier layer 52' shows no obvious difference for the samples with and without FL at the different temperatures. However, the residual stress of metal barrier layer 52' increases abruptly when the temperature is up to about 250° C., when temperature goes back to room temperature after the thermal cycle, the residual stress has no obvious change.

This could be due to the FL does not have much impact on the residual stress, it could be too thin to show the effect of this layer on the stress. However, the standard scotch tape test and CMP test show that this FL is helpful to enhance the interface of metal barrier layer 52' and ultra-low-k material in layer 13" and helps to solve the peeling issues during CMP. The FL 66 also reduces the "cracking" of metal barrier layer 52', resulting from stress induced due to the change of the damascene profile, and the FL affects the reliability. It is due to the coefficient of thermal expansion (CTE) (for example: CTE of SiLK is about 65, Ta is about 6.6). To build devices, wafers shall be treated many thermal cycles, if CTE of material is different, the film expansion could result in higher stress and film cracking, and also may affect profile of damascene structure.

ET Results; Cu/Organic Ultra-Low-k (ULK) (P-SiLK)—FIGS. 16, 17, 18, 19 and 20

Figure 16:
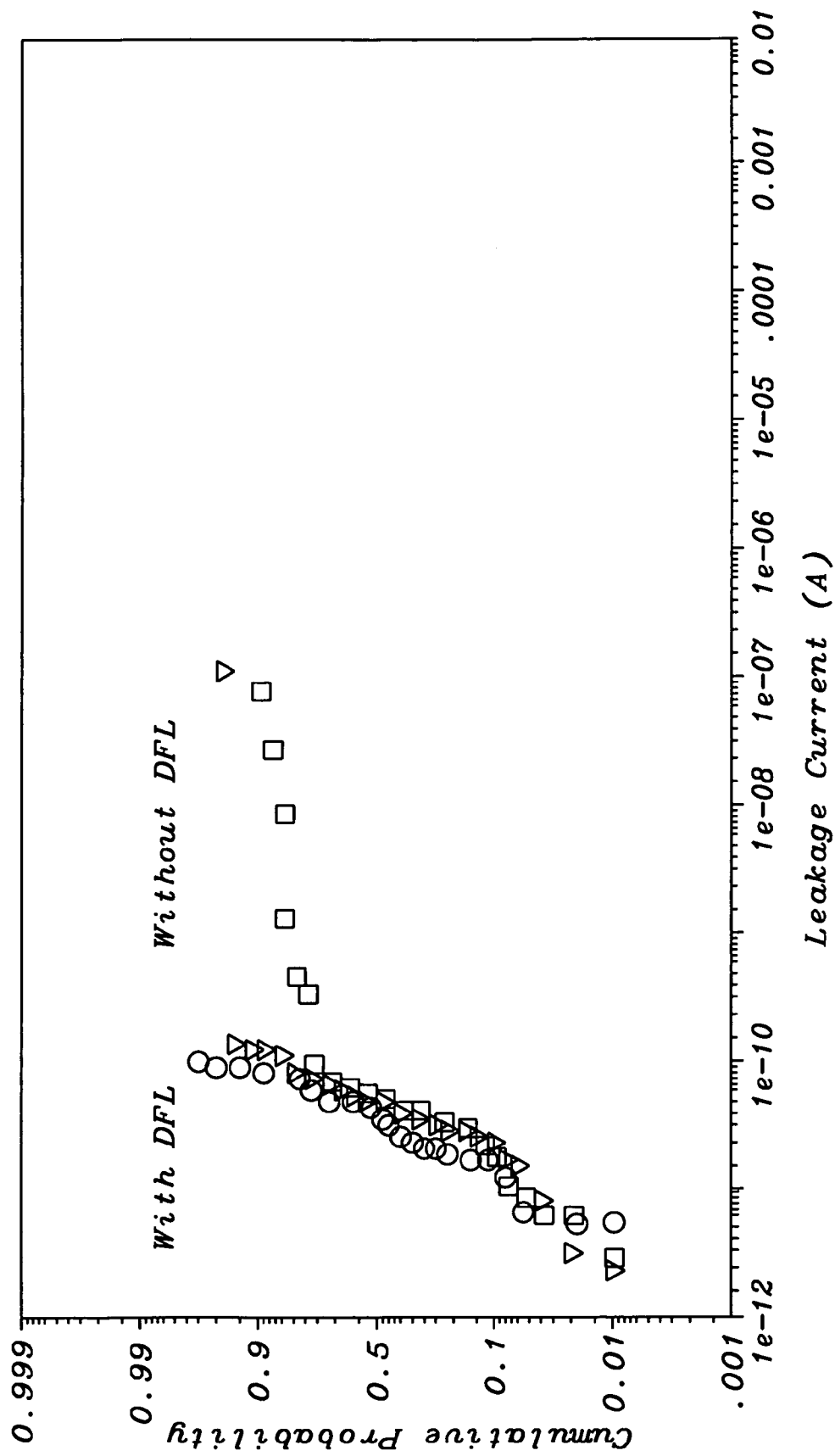
FIG. 16 illustrates the cumulative distribution of line-line leakage current (0.18/0.18 μm) of the samples with/without DFL ($Si_xC_yN_z$ or $Si_xC_yO_z$) (ultra low dielectric constant (k), i.e. less than about 2.5 (ULK): P-SiLK).

FIG. 16 illustrates cumulative distribution of line-line leakage current (0.18/0.18 μm) of the samples with/without FL 66 for organic (ultra low dielectric constant (k), i.e. less than about 2.5 (ULK): P-SiLK.

Figure 17:
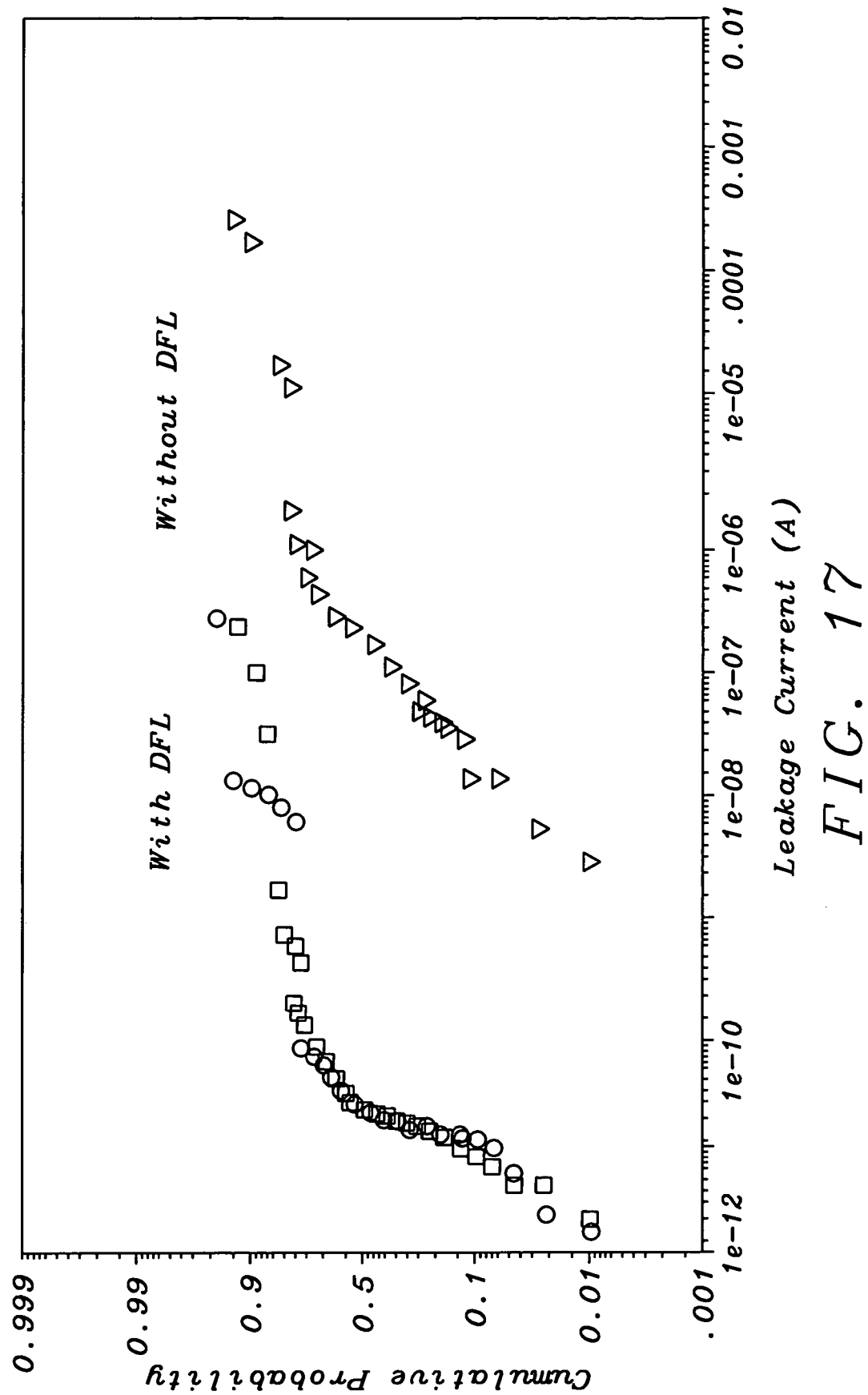
FIG. 17 illustrates the cumulative distribution of line-line leakage current (0.18/0.18 μm) of the samples with/without DFL ($Si_xC_yN_z$ or $Si_xC_yO_z$) after annealing at 350° C. for 1 hour under $N_2$ ambient (ultra low dielectric constant (k), i.e. less than about 2.5 (ULK): P-SiLK).

FIG. 17 illustrates the line-line leakage current of the samples with/without DFL after 350° C. 1 hour annealing under $N_2$ ambient for organic ULK (P-SiLK).

Figure 18:
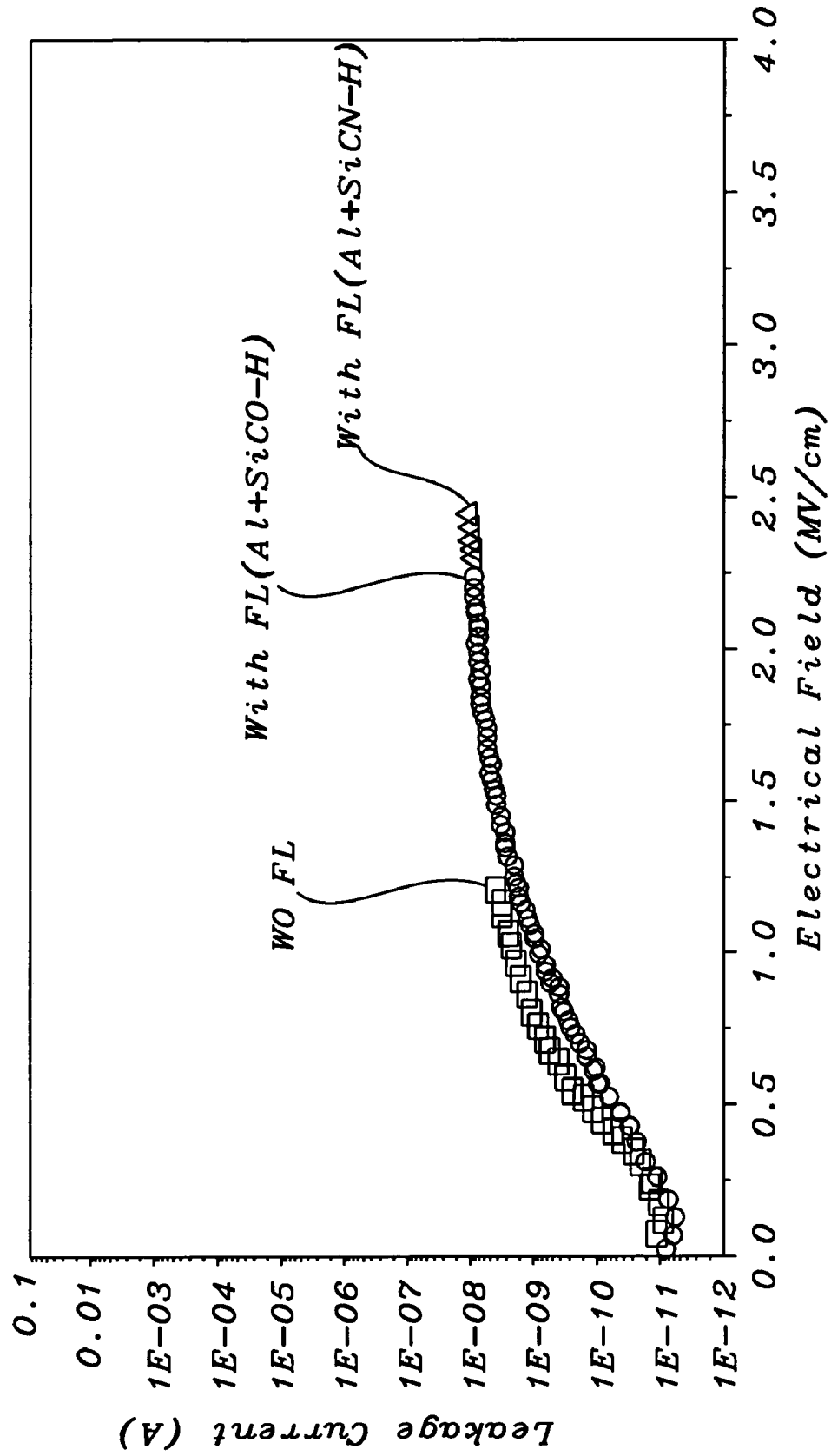
FIG. 18 illustrates the line-line leakage current vs. applied electrical field, measured at room temperature of the samples with/without DFL ($Si_xC_yN_z$ or $Si_xC_yO_z$) (average of 12 die) (ultra low dielectric constant (k), i.e. less than about 2.5 (ULK): P-SiLK).

FIG. 18 illustrates line-line leakage current vs. applied electrical field, measured at room temperature of the samples with/without FL. (average of 12 die).

Figure 19:
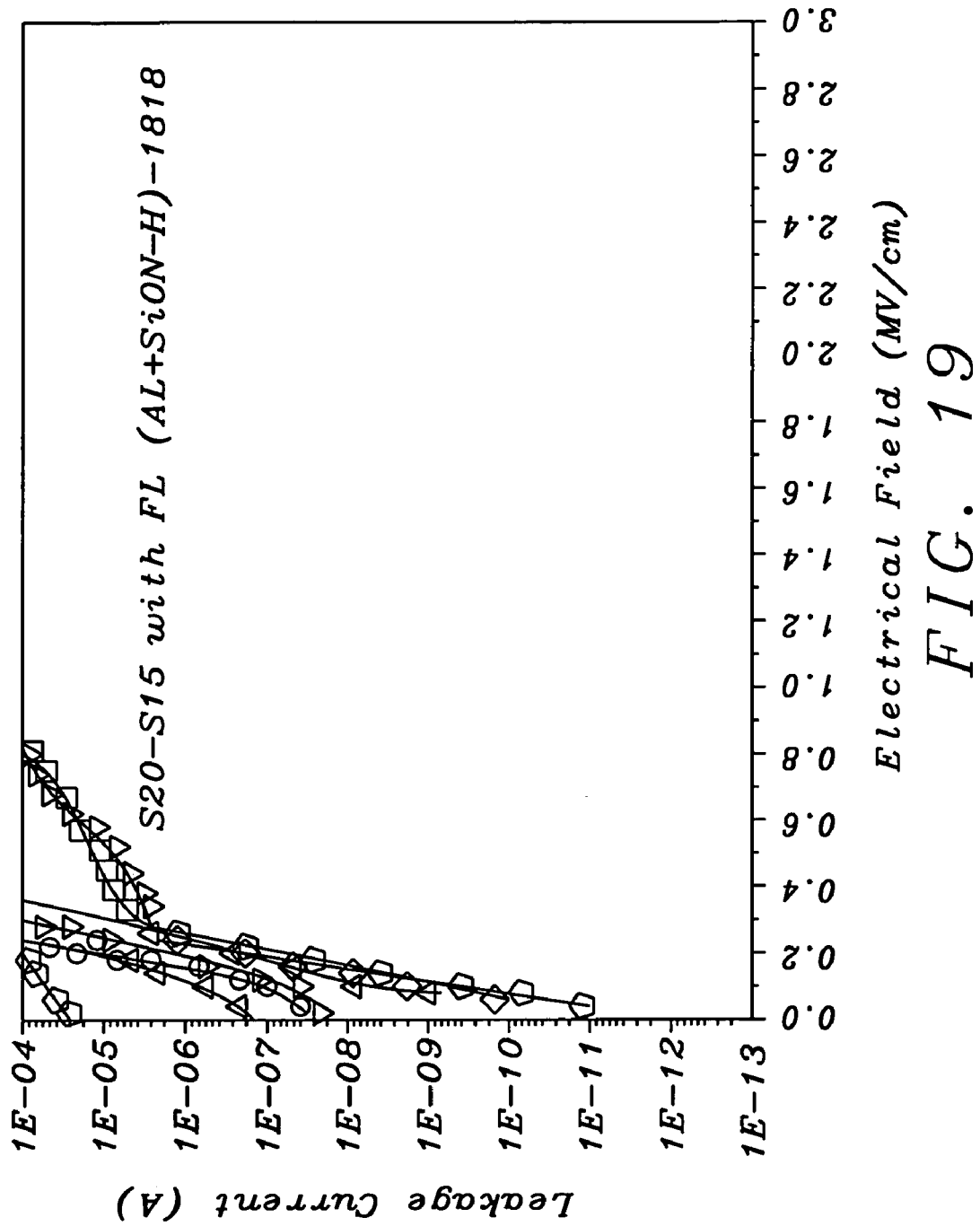
FIG. 19 illustrates line-line leakage current vs. applied electrical field, measured at room temperature of the samples using SiON—H as DFL instead of using $Si_xC_yN_z$ or $Si_xC_yO_z$ as DFL. The line-width and space are the same (0.18 μm).
Figure 20:
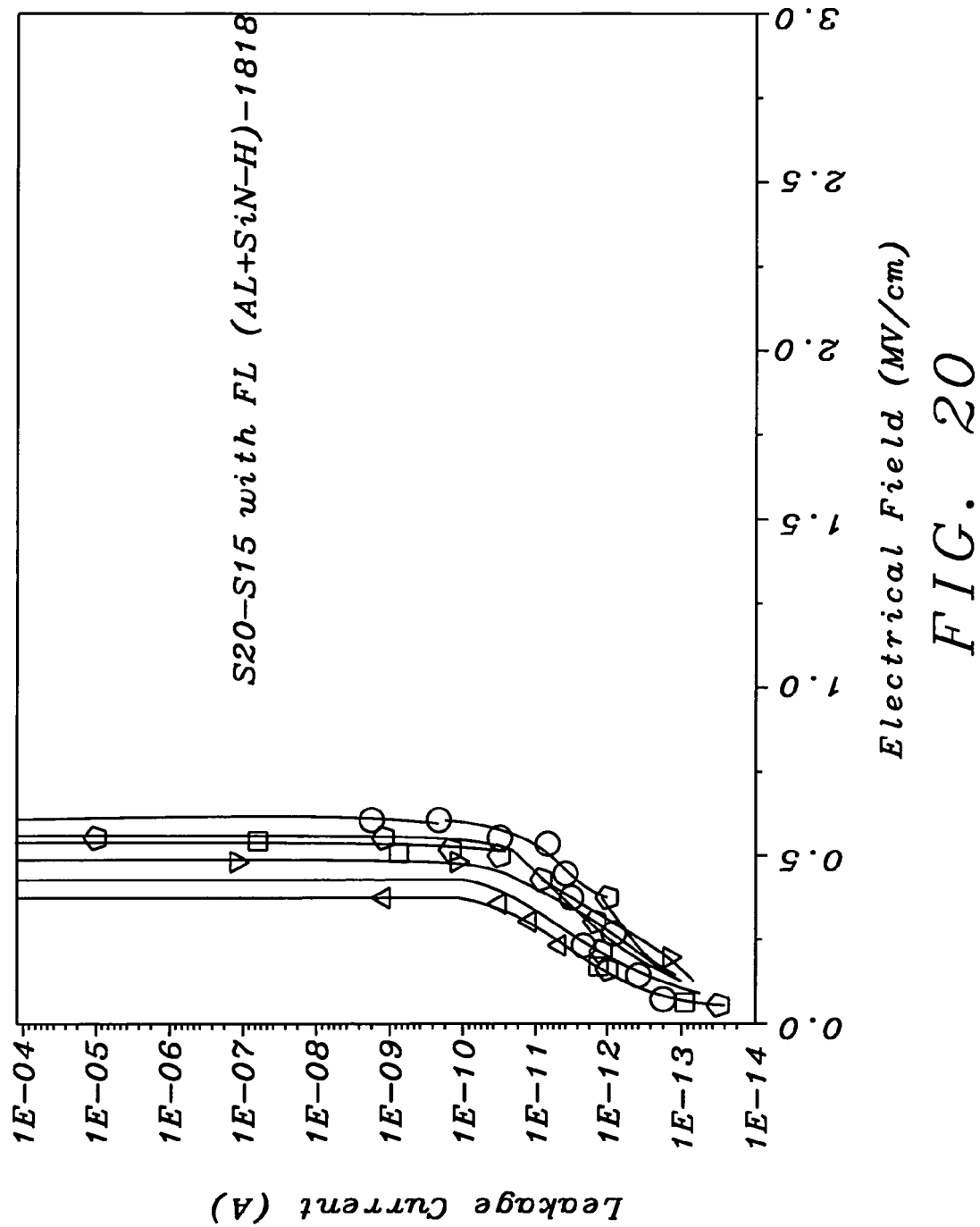
FIG. 20 illustrates line-line leakage current vs. applied electrical field, measured at room temperature of the samples using SiN as DFL instead of using $Si_xC_yN_z$ or $Si_xC_yO_z$ as DFL. The line-width and space are the same (0.18 μm).

FIGS. 19 and 20 illustrate line-line leakage current vs. applied electrical field, measured at room temperature of the samples with different DFL: a) with FL (Al+SiON); b) with FL (Al+SiN). The line-width and space are the same (0.18 μm).

It was found that the line-line (0.18/0.18 μm) leakage current measured at 5 V at room temperature of the samples with/without DFL 41" has no obvious difference. However, by increasing the applied electrical field to the samples, the leakage current did not change significantly till about 22 V, which corresponds to an electrical field of 1.4 MV/cm for samples without DFL 41", 7 V (0.4 MV/cm) for samples with SiON DFL, 9 V (0.5 MV/cm) for samples with SiN DFL 41", 42 V (2.3 MV/cm) for samples with Al layer 51' and SiCN—H DFL 41" or Al layer 51'+SiCO—H DFL 41", respectively, and it increases abruptly after this as shown in FIG. 18, FIG. 19 and FIG. 20.

Figure 21:
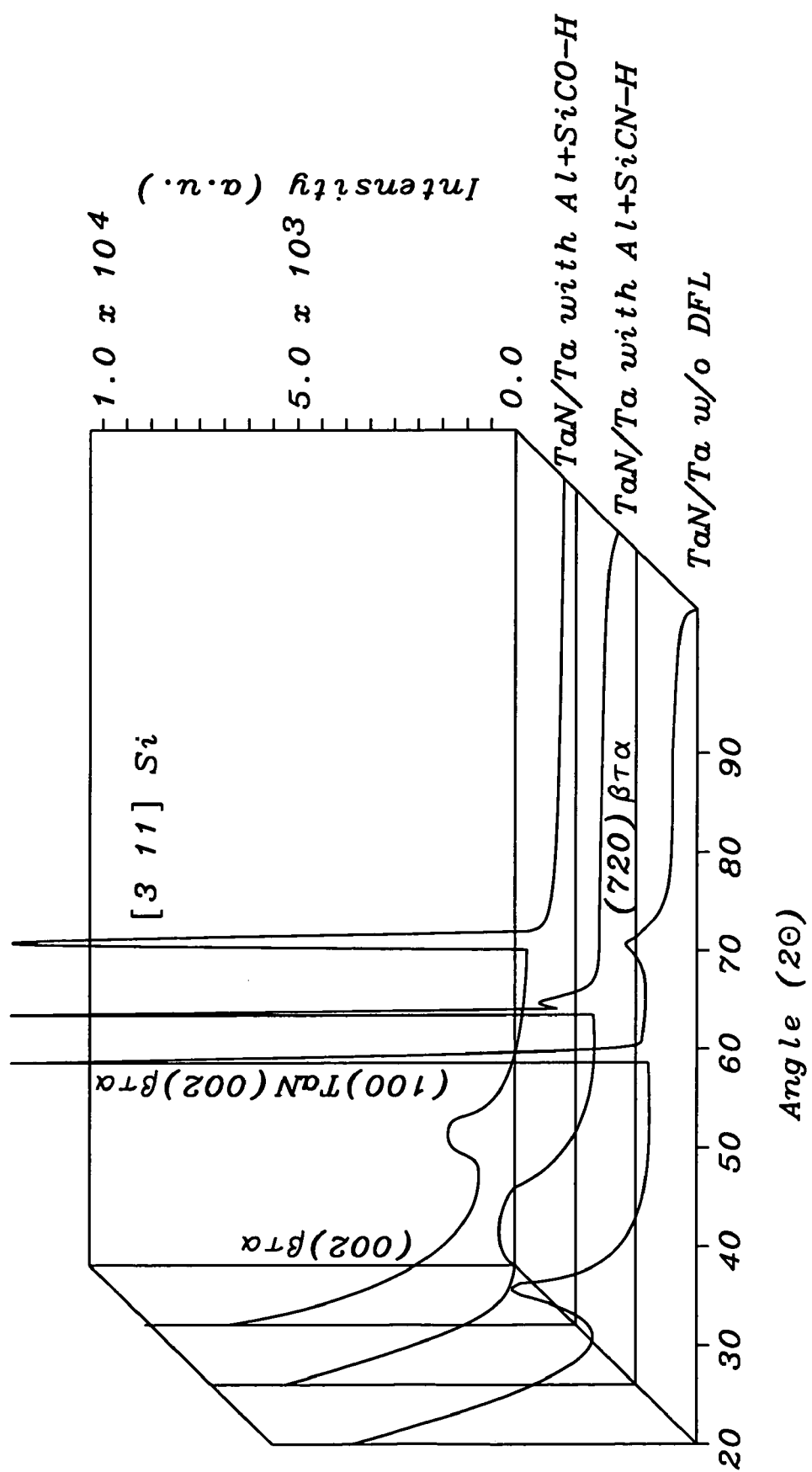
FIG. 21 illustrates an X-ray diffraction (XRD) of a barrier metal with and without a Flash Layer which is a thin layer of Al and DFL, i.e. Al+SiCO—H or Al+SiCN—H.
Figure 22:
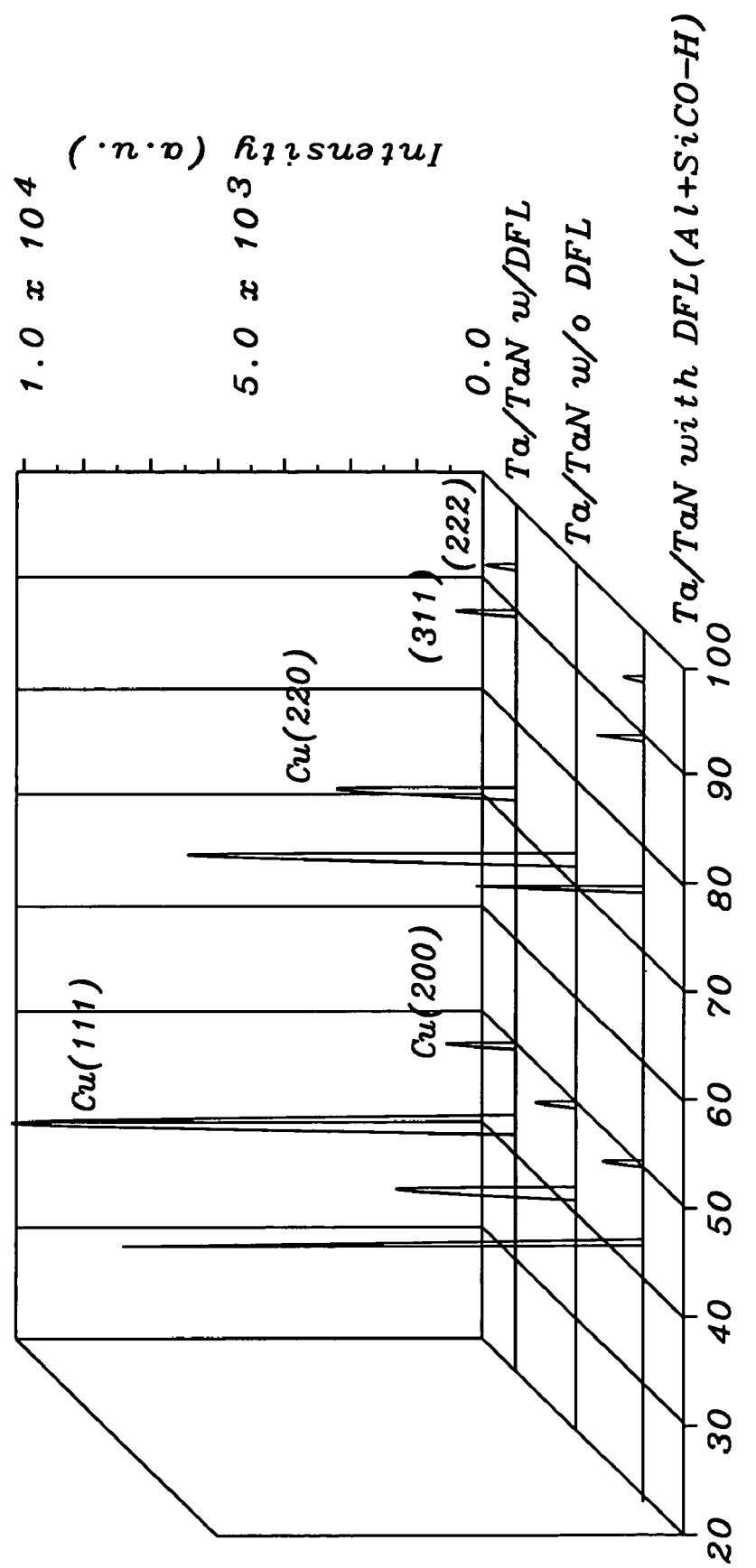
FIG. 22 illustrates an X-ray diffraction (XRD) of Cu/barrier metal with/without a Flash Layer which is a thin layer of Al and DFL, i.e. Al+SiCO—H or Al+SiCN—H.

X-Ray Diffraction (XRD) Results—FIGS. 21 and 22

As shown in FIGS. 21 and 22, X-ray diffraction (XRD) was carried out to identify the texture structure of metal barrier layer 52' and Cu seed layer with/without DFL (SiCO—H or SiCN—H) on organic low k/ultra-low k materials of organic dielectric layer 13".

As shown in FIG. 21, is clear that self-ionized plasma (SIP) (used to deposit barrier metal layer 52) TaN/Ta with FL (Al layer 51 and DFL 41") on organic low-k/ultra-low-k layer 13" has a nanocrystalline grain structure or at least a significant amount of nanocrystalline structure in an amorphous matrix. It is thus considered as a robust barrier film against Cu diffusion. As compared to the SIP TaN/Ta on organic low-k/ultra-low-k layer 13", the SIP TaN/Ta forms a crystal microstructure with amorphous matrix TaN layer, respectively. The FL (Al layer 51 and DFL 41") is about 10 to 20 nm thick and it obviously affects texture structure of metal barrier layer 52'. It could be due to the different nucleation and surface mobility of metal barrier layer 52' on a different substrate.

FIG. 22 illustrates the texture structure of electrochemical plated (ECP) Cu on metal barrier layers 52' with/without FL (Al layer 51 and DFL 41"). It indicates that a strong Cu (111) texture can be achieved for the samples with FL (Al layer 51 and DFL 41"). It could provide a better performance of device in terms of reliability.

The electrical tests and burn-in and voltage ramp tests reveal that leakage current of the metal line in the comb structure could be significantly improved due to: metal barrier layer 52' microstructure, the lack of pin-holes, interface of metal barrier layer 52 and organic low k/ultra-low-k dielectric layer 13". DFL 41" plays a more important role in Cu/organic low k or ultra-low k integration and reliability.

1) The advantages of one or more embodiments of the present invention include: the new invention could achieve better electrical test results, reduce the line to line leakage current, enhance the reliability in Cu/organic low k or Cu/organic ultra-low k interconnects;
2) the new invention is to reduce pin-hole and achieve more robust barrier layer against Cu diffusion;
3) this invention is to integrate Cu into all organic low k or ultra-low k in 90 or 65 nm technology node below using standard processes; and
4) this invention is to allow a barrier layer having good adhesion strength to organic low k or ultra-low k materials, help to solve Cu/barrier delamination issue during chemical mechanical polish (CMP) process in Cu/organic low k or Cu/organic ultra-low k integration.

While particular embodiments of the present invention have been illustrated and described, it is not intended to limit the invention, except as defined by the following claims.

We claim:

1. A method of forming a composite barrier layer, comprising the steps of:
    providing a substrate having a dielectric layer formed thereover;
    forming an opening within the dielectric layer; the opening exposing a first portion of the substrate;
    forming a dielectric flash layer within the opening and over the first exposed portion of the substrate; the dielectric flash layer lining the opening;
    removing the bottommost horizontal portion of the dielectric flash layer to expose a second portion of the substrate;
    forming an aluminium layer over the etched dielectric flash layer and over the second exposed portion of the substrate;
    forming a barrier metal layer over the aluminium layer; the etched dielectric flash layer, aluminium layer and the barrier metal layer comprising the composite barrier layer; and
    forming a planarized metal plug within the barrier metal layer lined opening.

2. The method of claim 1, wherein the substrate is a partially completed integrated circuit.

3. The method of claim 1, including the formation of a lower etch stop layer between the substrate and the dielectric layer.

4. The method of claim 1, wherein the dielectric layer is an organic dielectric layer.

5. The method of claim 1, wherein the dielectric layer is an organic dielectric layer having a dielectric constant of from about 2.0 to 2.8.

6. The method of claim 1, wherein the dielectric layer is an organic dielectric layer having a dielectric constant of from about 2.2 to 2.6.

7. The method of claim 1, wherein the dielectric layer is comprised of a polymer having a dielectric constant of less than about 3.0.

8. The method of claim 1, wherein the dielectric layer is comprised of SiLK, porous SiLK or nano-glass.

9. The method of claim 1, wherein the dielectric layer is comprised of porous SiLK.

10. The method of claim 1, wherein the opening is a damascene opening.

11. The method of claim 1, wherein the opening is a dual damascene opening.

12. The method of claim 1, wherein the dielectric flash layer is comprised of $Si_xC_yN_z$—H, $Si_xC_yO_z$—H or $Si_xC_y$—H.

13. The method of claim 1, wherein the dielectric flash layer 41 is comprised of $Si_xC_yN_z$—H or $Si_xC_yO_z$—H.

14. The method of claim 1, wherein the dielectric flash layer has a thickness of from about 5 to 20 nm, the aluminum layer has a thickness of from about 2.0 to 10.0 nm and the metal barrier layer has a thickness of from about 10 to 25 nm.

15. The method of claim 1, wherein the dielectric flash layer has a thickness of from about 10 to 20 nm, the aluminum layer has a thickness of from about 5 to 10 mn and the metal barrier layer has a thickness of from about 15 to 20 nm.

16. The method of claim 1, wherein the metal barrier layer is comprised of a refractory metal or one of their nitrides.

17. The method of claim 1, wherein the metal barrier layer is comprised of Cr, Nb, Mo, W or Ta or one of their nitrides.

18. The method of claim 1, wherein the metal barrier layer is comprised of Ta, TaN or Ta/TaN.

19. The method of claim 1, wherein the dielectric flash layer is formed using plasma enhanced chemical vapor deposition (PECVD) techniques.

20. The method of claim 1, wherein the dielectric flash layer is formed using under the following conditions:
   a pressure of from about 1.0 to 5.0 Torr;
   a power level of from about 150 to 1000 watts; and
   a temperature of from about 250 to 350° C.

21. The method of claim 1, wherein the dielectric flash layer is comprised employing 3-methyl silane or 4-methyl silane.

22. The method of claim 1, wherein the dielectric flash layer is comprised employing 3-methyl silane or 4-methyl silane; and with $NH_3$ or $N_2O$.

23. The method of claim 1, wherein the bottommost horizontal portion of the dielectric flash layer is removed using a plasma sputtering process or a plasma etching process.

24. The method of claim 1, wherein the bottommost horizontal portion of the dielectric flash layer is removed using $CH_2F_2$ or $CHF_3$ under the following conditions:
   a pressure of from about 10 to 100 mTorr; and
   a power of from about 100 to 1000 watts; for a time of from about 5 to 25 seconds.

25. The method of claim 1, wherein the aluminum layer is formed at a temperature of less than about 250° C.

26. The method of claim 1, wherein the dielectric flash layer is silicon nitride or silicon oxide.

27. The method of claim 1, wherein the dielectric flash layer is silicon oxide.

28. A method of forming a composite barrier layer, comprising the steps of:
   providing a substrate having a dielectric layer formed thereover;
   forming a damascene opening within the dielectric layer; the damascene opening exposing a first portion of the substrate;
   forming a dielectric flash layer within the damascene opening and over the first exposed portion of the substrate; the dielectric flash layer lining the opening;
   removing the bottommost horizontal portion of the dielectric flash layer to expose a second portion of the substrate;
   forming an aluminium layer over the etched dielectric flash layer and over the second exposed portion of the substrate;
   forming a barrier metal layer over the aluminium layer; the etched dielectric flash layer, aluminium layer and the barrier metal layer comprising the composite barrier layer; and
   forming a planarized metal plug within the barrier metal layer lined damascene opening.

29. The method of claim 28, wherein the substrate is a partially completed integrated circuit.

30. The method of claim 28, including the formation of a lower etch stop layer between the substrate and the dielectric layer.

31. The method of claim 28, wherein the dielectric layer is an organic dielectric layer.

32. The method of claim 28, wherein the dielectric layer is an organic dielectric layer having a dielectric constant of from about 2.0 to 2.8.

33. The method of claim 28, wherein the dielectric layer is an organic dielectric layer having a dielectric constant of from about 2.2 to 2.6.

34. The method of claim 28, wherein the dielectric layer is comprised of a polymer having a dielectric constant of less than about 3.0.

35. The method of claim 28, wherein the dielectric layer is comprised of SiLK, porous SiLK or nano-glass.

36. The method of claim 28, wherein the dielectric layer is comprised of porous SiLK.

37. The method of claim 28, wherein the damascene opening is a dual damascene opening.

38. The method of claim 28, wherein the dielectric flash layer is comprised of $Si_xC_yN_z$—H, $Si_xC_y$—H or $Si_xC_y$—H.

39. The method of claim 28, wherein the dielectric flash layer 41 is comprised of $Si_xC_yN_z$—H or $Si_xC_yO_z$—H.

40. The method of claim 28, wherein the dielectric flash layer has a thickness of from about 5 to 20 nm, the aluminum layer has a thickness of from about 2.0 to 10.0 nm and the metal barrier layer has a thickness of from about 10 to 25 nm.

41. The method of claim 28, wherein the dielectric flash layer has a thickness of from about 10 to 20 nm, the aluminum layer has a thickness of from about 5 to 10 rim and the metal barrier layer has a thickness of from about 15 to 20 nm.

42. The method of claim 28, wherein the metal barrier layer is comprised of a refractory metal or one of their nitrides.

43. The method of claim 28, wherein the metal barrier layer is comprised of Cr, Nb, Mo, W or Ta or one of their nitrides.

44. The method of claim 28, wherein the metal barrier layer is comprised of Ta, TaN or Ta/TaN.

45. The method of claim 28, wherein the dielectric flash layer is formed using plasma enhanced chemical vapor deposition (PECVD) techniques.

46. The method of claim 28, wherein the dielectric flash layer is formed using under the following conditions:
   a pressure of from about 1.0 to 5.0 Torr;
   a power level of from about 150 to 1000 waifs; and
   a temperature of from about 250 to 350° C.

47. The method of claim 28, wherein the dielectric flash layer is comprised employing 3-methyl silane or 4-methyl silane.

48. The method of claim 28, wherein the dielectric flash layer is comprised employing 3-methyl silane or 4-methyl silane; and with $NH_3$ or $N_2O$.

49. The method of claim 28, wherein the bottommost horizontal portion of the dielectric flash layer is removed using a plasma sputtering process or a plasma etching process.

50. The method of claim 28, wherein the bottommost horizontal portion of the dielectric flash layer is removed using $CH_2F_2$ or $CHF_3$ under the following conditions:
   a pressure of from about 10 to 100 mTorr; and
   a power of from about 100 to 1000 watts;
   for a time of from about 5 to 25 seconds.

51. The method of claim 28, wherein the aluminum layer is formed at a temperature of less than about 250° C.

52. The method of claim 28, wherein the dielectric flash layer is silicon nitride or silicon oxide.

53. The method of claim 28, wherein the dielectric flash layer is silicon oxide.

54. A method of forming a composite barrier layer, comprising the steps of:
   providing a substrate having a dielectric layer formed thereover;

forming a damascene opening within the dielectric layer; the damascene opening exposing a first portion of the substrate;

forming a dielectric flash layer within the damascene opening and over the first exposed portion of the substrate; the dielectric flash layer lining the opening; the dielectric flash layer being comprised of $Si_xO_y$;

removing the bottommost horizontal portion of the dielectric flash layer to expose a second portion of the substrate;

forming an aluminium layer over the etched dielectric flash layer and over the second exposed portion of the substrate;

forming a barrier metal layer over the aluminium layer; the etched dielectric flash layer, aluminium layer and the barrier metal layer comprising the composite barrier layer; and forming a planarized metal plug within the barrier metal layer lined damascene opening.

55. The method of claim 54, wherein the substrate is a partially completed integrated circuit.

56. The method of claim 54, including the formation of a lower etch stop layer between the substrate and the dielectric layer.

57. The method of claim 54, wherein the dielectric layer is an organic dielectric layer.

58. The method of claim 54, wherein the dielectric layer is an organic dielectric layer having a dielectric constant of from about 2.0 to 2.8.

59. The method of claim 54, wherein the dielectric layer is an organic dielectric layer having a dielectric constant of from about 2.2 to 2.6.

60. The method of claim 54, wherein the dielectric layer is comprised of a polymer having a dielectric constant of less than about 3.0.

61. The method of claim 54, wherein the dielectric layer is comprised of SiLK, porous SiLK or nano-glass.

62. The method of claim 54, wherein the dielectric layer is comprised of porous SiLK.

63. The method of claim 54, wherein the damascene opening is a dual damascene opening.

64. The method of claim 54, wherein the dielectric flash layer has a thickness of from about 5 to 20 nm, the aluminum layer has a thickness of from about 2.0 to 10.0 nm and the metal barrier layer has a thickness of from about 10 to 25 nm.

65. The method of claim 54, wherein the dielectric flash layer has a thickness of from about 10 to 20 nm, the aluminum layer has a thickness of from about 5 to 10 nm and the metal barrier layer has a thickness of from about 15 to 20 nm.

66. The method of claim 54, wherein the metal barrier layer is comprised of a refractory metal or one of their nitrides.

67. The method of claim 54, wherein the metal barrier layer is comprised of Cr, Nb, Mo, W or Ta or one of their nitrides.

68. The method of claim 54, wherein the metal barrier layer is comprised of Ta, TaN or Ta/TaN.

69. The method of claim 54, wherein the dielectric flash layer is formed using plasma enhanced chemical vapor deposition (PECVD) techniques.

70. The method of claim 54, wherein the dielectric flash layer is formed using under the following conditions:
a pressure of from about 1.0 to 5.0 Torr;
a power level of from about 150 to 1000 watts; and
a temperature of from about 250 to 350° C.

71. The method of claim 54, wherein the dielectric flash layer is comprised employing 3-methyl silane or 4-methyl silane.

72. The method of claim 54, wherein the dielectric flash layer is comprised employing 3-methyl silane or 4-methyl silane; and with $NH_3$ or $N_2O$.

73. The method of claim 54, wherein the bottommost horizontal portion of the dielectric flash layer is removed using a plasma sputtering process or a plasma etching process.

74. The method of claim 54, wherein the bottommost horizontal portion of the dielectric flash layer is removed using $CH_2F_2$ or $CHF_3$ under the following conditions:
a pressure of from about 10 to 100 mTorr; and
a power of from about 100 to 1000 watts.

75. The method of claim 54, wherein the aluminum layer is formed at a temperature of Less than about 250° C.

* * * * *